(12) United States Patent
Yamasaki et al.

(10) Patent No.: US 7,582,552 B2
(45) Date of Patent: Sep. 1, 2009

(54) ELECTRONIC APPARATUS WITH BUSBAR ASSEMBLY AND ELECTRONIC COMPONENT MOUNTED THEREON BY SOLDERING

(75) Inventors: Masashi Yamasaki, Nagoya (JP); Mutsumi Yoshino, Nagoya (JP)

(73) Assignee: Denso Corporation, Kariya (JP)

( * ) Notice: Subject to any disclaimer, the term of this patent is extended or adjusted under 35 U.S.C. 154(b) by 127 days.

(21) Appl. No.: 11/976,988

(22) Filed: Oct. 30, 2007

(65) Prior Publication Data

US 2008/0099906 A1 May 1, 2008

(30) Foreign Application Priority Data

Oct. 30, 2006 (JP) .............................. 2006-294350
Jun. 4, 2007 (JP) .............................. 2007-148377

(51) Int. Cl.
*H01L 21/44* (2006.01)
*H01L 21/50* (2006.01)
*H01L 21/48* (2006.01)
*H01L 23/52* (2006.01)
*H01L 23/48* (2006.01)
*H01L 29/40* (2006.01)
*H01L 23/488* (2006.01)

(52) U.S. Cl. ........................ 438/612; 438/123; 438/119; 257/779; 257/772; 257/E23.023

(58) Field of Classification Search ................. 438/612, 438/123, 119; 257/779, 772, E23.023
See application file for complete search history.

(56) References Cited

U.S. PATENT DOCUMENTS

| 5,585,672 | A | * | 12/1996 | Koike et al. | .................. 257/707 |
| 5,661,343 | A | * | 8/1997 | Takahashi et al. | ............ 257/723 |
| 5,929,519 | A | * | 7/1999 | Mori et al. | .................... 257/724 |
| 6,072,240 | A | * | 6/2000 | Kimura et al. | ............... 257/735 |
| 6,388,319 | B1 | * | 5/2002 | Cheah et al. | ................. 257/723 |
| 2004/0119155 | A1 | | 6/2004 | Hisada et al. | |

FOREIGN PATENT DOCUMENTS

JP        A-2004-200464        7/2004

OTHER PUBLICATIONS

H. Takao et al., "Characteristics Evaluation of Pb Free Solder Alloys (1)—Melting Properties and Wettability—", $3^{rd}$ Symposium on "Microjoining and Assembly Technology in Electronics", Feb. 6-7, 1997, pp. 71-76.

* cited by examiner

*Primary Examiner*—Luan C Thai
(74) *Attorney, Agent, or Firm*—Oliff & Berridge, PLC

(57) ABSTRACT

In an electronic apparatus, a busbar assembly is composed of busbars made of at least one previously selected metal material. Each of the busbars has one surface. A solder joint is made of an alloy of previously selected metal materials and placed on the one surface of at least one busbar. The solder joint is changed from a molten state to a solid state to thereby mechanically and electrically connect an electronic component to the one surface of the at least one busbar. The at least one previously selected metal material of the at least one busbar and the previously selected metal materials of the alloy of the solder joint determine that a contact angle of the molten solder joint to the one surface of the at least one busbar is within an angular range of 40 to 60 degrees.

18 Claims, 18 Drawing Sheets

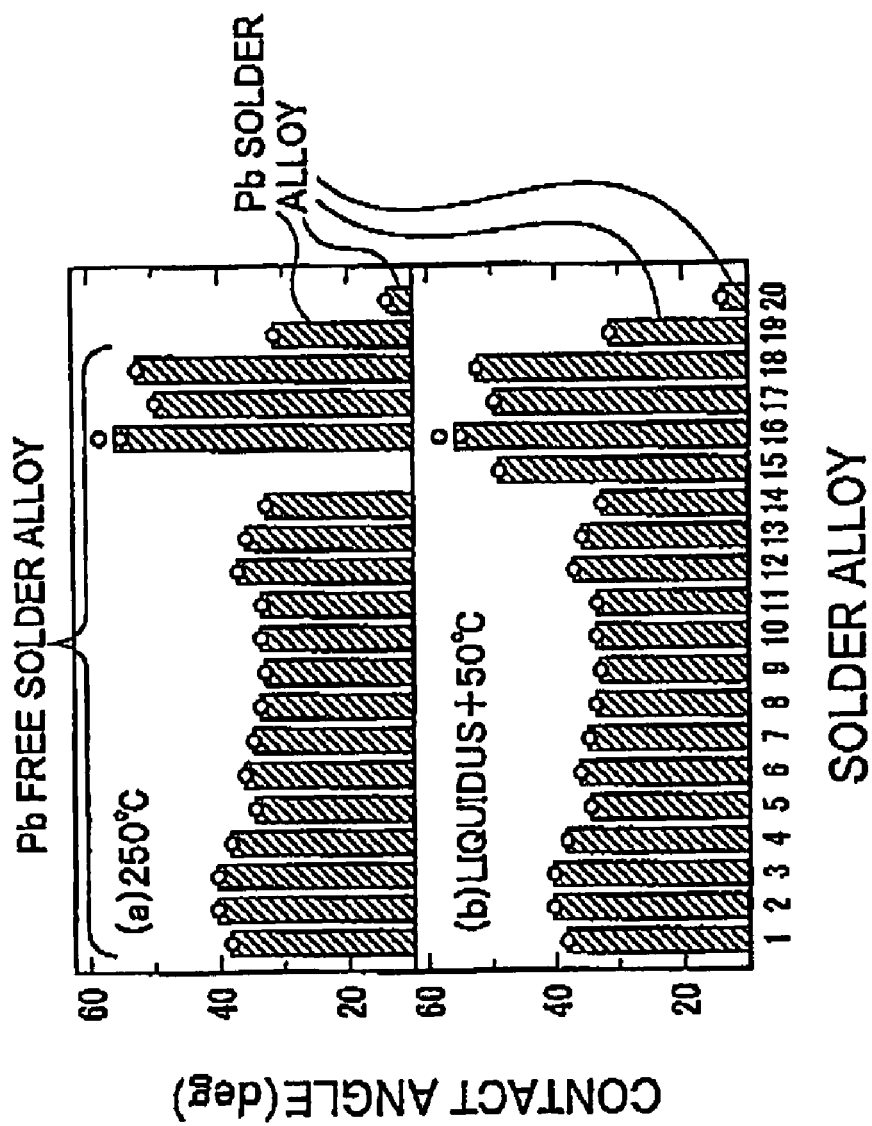

FIG.6

(FIRST EXAMPLE)
SOLDER ALLOY : Pb FREE SOLDER ALLOY OF Sn-Ag-Cu
+
PLATING MATERIAL : Ni PLATING

FILLET HAS EXCELLENT SHAPE (SECOND EXAMPLE)
SOLDER ALLOY : Pb FREE SOLDER ALLOY OF Sn-Ag-Cu
+
PLATING MATERIAL : Ni-P PLATING

FILLET HAS EXCELLENT SHAPE (THIRD EXAMPLE)
SOLDER ALLOY : Pb FREE SOLDER ALLOY OF Sn-Ag-Cu
+
PLATING MATERIAL : Sn PLATING

FILLET HAS BAD SHAPE (FOURTH EXAMPLE)
SOLDER ALLOY : Pb FREE SOLDER ALLOY OF Sn-Ag-Cu
+
PLATING MATERIAL : Ni-Au PLATING

FILLET HAS BAD SHAPE

FIG.15

ELECTRONIC APPARATUS WITH BUSBAR ASSEMBLY AND ELECTRONIC COMPONENT MOUNTED THEREON BY SOLDERING

CROSS REFERENCE TO RELATED APPLICATIONS

This application is based on Japanese Patent Applications No. 2006-294350 and No. 2007-148377 filed on Oct. 30, 2006 and Jun. 4, 2007, respectively. The descriptions of the Patent Application are all incorporated herein by reference.

FIELD OF THE INVENTION

The present invention relates to electronic apparatuses having a busbar assembly and an electronic component mounted thereon by soldering.

BACKGROUND OF THE INVENTION

As an example of conventional electronic apparatuses having a wiring board with a predetermined circuit pattern and a plurality of electronic components mounted thereon, an electronic apparatus is disclosed in US Patent Application Publication No. 2004/0119155 corresponding to Japanese Patent Application Publication No. 2004-200464.

A wiring board of the electronic apparatus disclosed in the US Patent Publication Application includes a wiring plate assembly composed of a plurality of metal wiring plates (busbars) assembled to each other to provide a predetermined circuit pattern. A plurality of lands are formed at predetermined locations of one surface of the wiring plate assembly so that a plurality of electronic components of the electronic apparatus are soldered on corresponding lands of the wiring plate assembly, respectively.

Excessive wicking of molten solder along a land and busbars therearound may not ensure adequate strength of solder joint. In order to solve the problem, the wiring board disclosed in the US Patent Publication Application is provided with a solder-resist layer with which a predetermined non-soldering area of the one surface of the wiring plate assembly is covered. The predetermined non-soldering area is located on the one surface of the wiring plate assembly except for the lands thereof. The solder resist layer prevents molten solder on the lands from being excessively traveled, maintaining adequate strength of solder joint.

SUMMARY OF THE INVENTION

In manufacturing the electronic apparatus disclosed in the US Patent Application Publication, a process of coating the predetermined non-soldering area with the solder resist layer is required. This causes the number of processes required to manufacture the electronic apparatus to increase.

In view of the circumstances set forth above, an object of at least one aspect of the present invention is to provide electronic apparatuses, which are capable of ensuring adequate strength of solder joint without requiring such a solder-resist layer coating process.

In order to implement such an object, the inventors of the present patent application have earnestly studied specific measures to implement the object while having taken a lot of trail and errors. As a result of the study, the inventors lead to completion of the present invention in which limitation of a contact angle of molten solder within a predetermined angular range of 40 to 60 degrees prevents the molten solder from being excessively traveled. This can maintain adequate strength of a solder joint corresponding to the molten solder between an electronic component and a busbar.

Specifically, according to one aspect of the present invention, there is provided an electronic apparatus. The electronic apparatus includes an electronic component, and a busbar assembly composed of a plurality of busbars made of at least one previously selected metal material. Each of the plurality of busbars has one surface. The plurality of busbars are arranged to be assembled so as to constitute a predetermined circuit pattern. The electronic apparatus includes a solder joint made of an alloy of previously selected metal materials and placed on the one surface of at least one of the plurality of busbars. The solder joint is changed from a molten state to a solid state to thereby mechanically and electrically connect the electronic component to the one surface of the at least one of the plurality of busbars. The at least one previously selected metal material of the at least one of the plurality of busbars and the previously selected metal materials of the alloy of the solder joint determine that a contact angle of the solder joint in the molten state with respect to the one surface of the at least one of the plurality of busbars is within an angular range of 40 to 60 degrees.

According to another aspect of the present invention, there is provided a method of manufacturing an electronic apparatus. The method includes preparing an electronic component, and selecting at least one metal material so as to prepare a busbar assembly composed of a plurality of busbars made of the at least one selected metal material, each of the plurality of busbars having one surface. The plurality of busbars are arranged to be assembled so as to constitute a predetermined circuit pattern. The method includes selecting an alloy of metal materials so as to form a solder joint made of the selected alloy of metal materials, and placing the solder joint on the one surface of at least one of the plurality of busbars. The method includes changing the solder joint placed on the one surface of the at least one of the plurality of busbars from a molten state to a solid state to thereby mechanically and electrically connect the electronic component to the one surface of the at least one of the plurality of busbars. The at least one selected metal material of the plurality of busbars and the selected alloy of metal materials of the solder joint determine that a contact angle of the solder joint in the molten state with respect to the one surface of the at least one of the plurality of busbars is within an angular range of 40 to 60 degrees.

BRIEF DESCRIPTION OF THE DRAWINGS

Other objects and aspects of the invention will become apparent from the following description of embodiments with reference to the accompanying drawings in which:

FIG. 5A is a table schematically illustrating different Sn-based Pb-free solder alloys and two tin-based Pb solder alloy (twenty different samples) according to the first embodiment;

FIG. 5B is graphs (a) and (b), the graph (a) of which schematically illustrates a measured contact angle (degrees) of each of the samples No. 1 to No. 20 when the temperature (reflow temperature) in a corresponding one of the samples No. 1 to No. 20 is kept at 250° C. according to the first embodiment, and the graph (b) of which schematically illustrates a measured contact angle (degrees) of each of the samples No. 1 to No. 20 when the temperature (reflow temperature) in a corresponding one of the samples No. 1 to No. 20 of solder alloys is kept at the sum of liquidus temperature thereof and 50° C.;

FIG. 6 is a table schematically illustrating the result of measurement of a contact angle (degrees) and a fillet of molten solder alloy of Sn—Ag—Cu in accordance with the well-known meniscograph method illustrated in FIG. 3 by immersing different alloys of the first to fourth examples according to the first embodiment;

FIG. 15 is a perspective view schematically illustrating a state in which the busbar plate is installed in the jig according to the second embodiment;

DETAILED DESCRIPTION OF EMBODIMENTS OF THE INVENTION

Embodiments of the present invention will be described hereinafter with reference to the accompanying drawings.

First Embodiment

Referring to FIGS. 1 to 11, an electronic apparatus 1 according to a first embodiment of the present invention consists of:

a busbar assembly BA;

a plurality of, such as three, IC components 2, 3, and 4 as electronic components according to the first embodiment; and a plurality of solder joints 13 between the IC components 2, 3, and 4 to the busbar assembly BA for electrically and mechanically connecting the IC components 2, 3, and 4 to the busbar assembly BA.

The busbar assembly BA is composed of a plurality of busbars 5 to 12. Each of the busbars 5 to 12 is, for example, a flat, plate-like conductor made of a copper as an example of conductive metals for carrying high electric currents.

Figure 1:
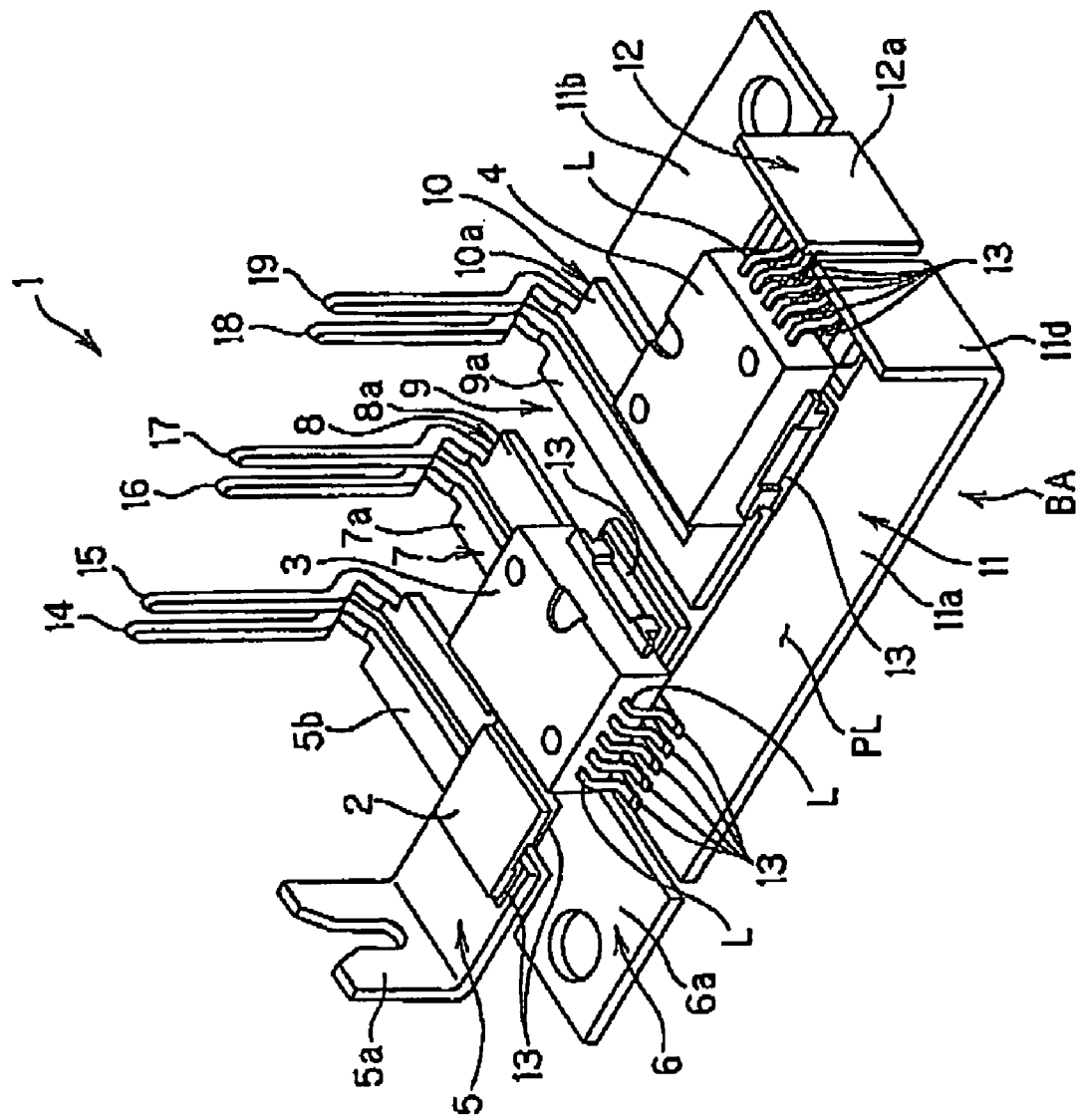
FIG. 1 is a perspective view schematically illustrating an example of the structure of an electronic apparatus according to a first embodiment of the present invention.

As illustrated in FIG. 1, the plurality of busbars 5 to 12 each having a predetermined shape are arranged on a same plane to be assembled to each other to provide a substantially rectangular wiring board constituting a predetermined circuit pattern.

One surface of each of the busbars 5 to 12 is coated with a metal-plated layer PL. The one surface of each of the busbars 5 to 12 on which the metal-plated layer PL is formed will be also referred to as "metal-plated surface PL", hereinafter.

In the first embodiment, no solder-resist layers (resin layers) are formed on the one surface of each of the busbars 5 to 12.

Figure 7:
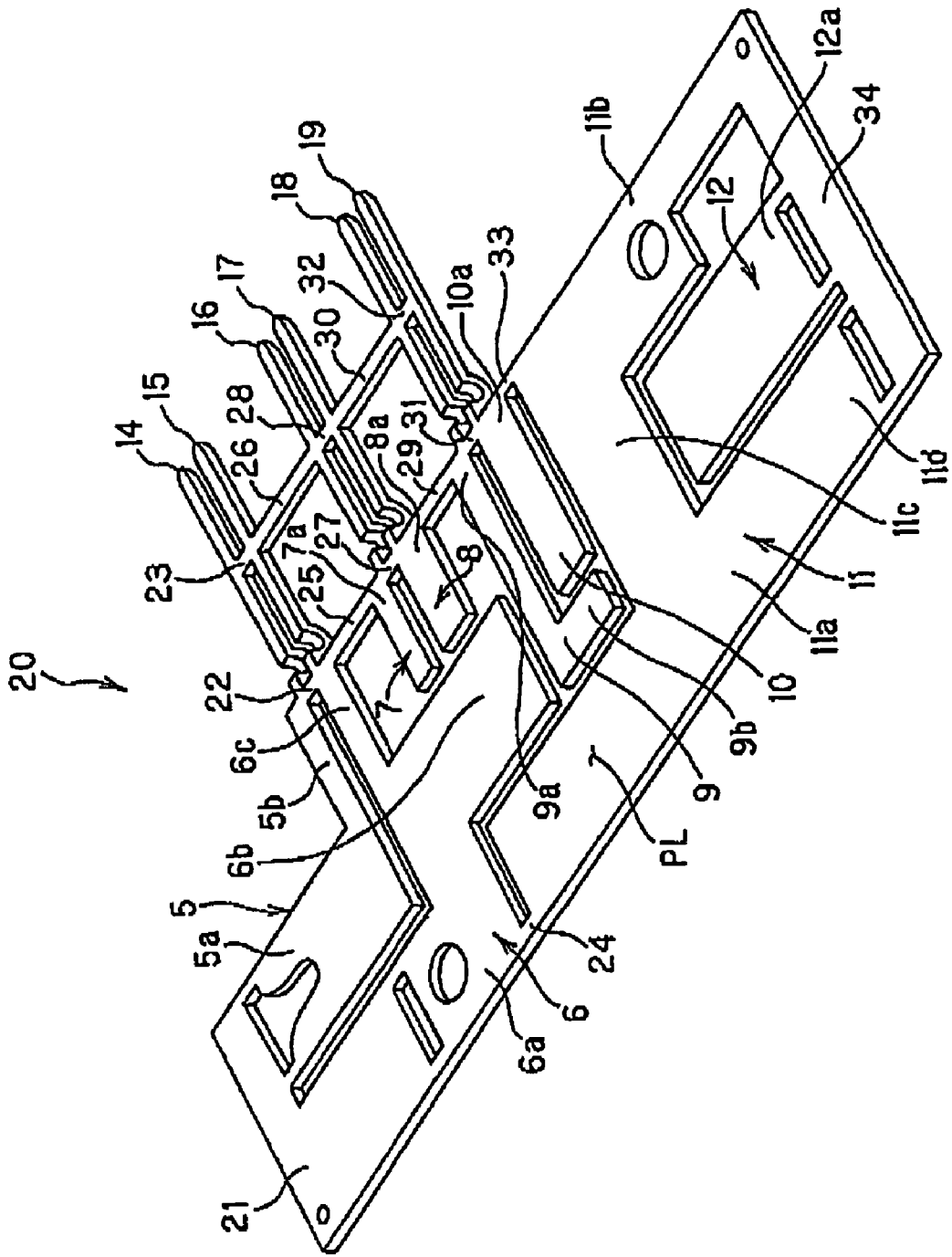
FIG. 7 is a perspective view schematically illustrating an example of the structure of a busbar plate according to the first embodiment.

For example, as illustrated in FIGS. 1 and 7, one lateral end 5a of the rectangular busbar 5 and a first rectangular part 6a of the busbar 6 constitute one lateral end of the rectangular busbar assembly BA. The rectangular part 6a of the busbar 6 and a first rectangular part 11a of the busbar 11 constitute one longitudinal end of the rectangular busbar assembly BA.

One lateral end of the first rectangular part 11a and one lateral end of a second rectangular part 11b of the busbar 11 and one lateral end 12a of the rectangular busbar 12 constitute the other lateral end of the rectangular busbar assembly BA. The first and second rectangular parts 11a and 11b are continuously linked to each other via a third rectangular part 11c.

A tip end of an extending portion 5b of the other lateral end of the rectangular busbar 5 and that of an extending portion 6c of one lateral end of a second rectangular part 6b continuing at its one lateral end from the first rectangular part 6a constitute part of the other longitudinal end of the rectangular busbar assembly BA. Similarly, respective one lateral ends 7a, 8a, 9a, and 10a of the busbars 7, 8, 9, and 10, and the second rectangular part 11b of the busbar 11 constitute the remaining part of the other longitudinal end of the rectangular busbar assembly BA.

The busbar 9 has a substantially L-shape so that the other lateral end 9b thereof is bent at 90 degrees to extend opposing the third rectangular part 11c of the busbar 11 with a space therebetween. The busbar 10 is arranged opposing the third rectangular part 11c of the busbar 11 with a space therebetween.

To the tip ends of the extending portions 5b and 6c and the one lateral ends 7a, 8a, 9a, and 10a of the respective busbars 7, 8, 9, and 10, terminal bars 14, 15, 16, 17, 18, and 19 are continuously formed.

The one lateral end 5a, one lateral end 11d, and one lateral end 12a of the rectangular busbars 5, 11, and 12 are orthogonally bent toward the plated-layer sides thereof, respectively. Similarly, the terminal bars 14, 15, 16, 17, 18, and 19 continuously formed to the tip ends of the extending portions 5b and 6c and the one lateral ends 7a, 8a, 9a, and 10a of the respective busbars 7, 8, 9, and 10 are orthogonally bent toward the plated-layer sides of the busbars 5, 6, 7, 8, 9, and 10, respectively.

The IC component 2 is designed as, for example, a bare chip component. The IC component 2 is composed of an IC chip and a plurality of leads located on a bottom surface of the IC chip.

The IC component (IC chip) 2 is fixedly mounted at its bottom surface on a predetermined located land of the metal-plated surface PL of the busbar 5 and that of the busbar 6 by the solder joints 13 located between the bottom surface of the IC component 2 and the lands of the busbars 5 and 6.

Each of the IC components 3 and 4 is designed as, for example, a small-outline packaged component. Each of the IC components 3 and 4 is composed of an IC chip and a rectangular package encapsulating it.

Each of the IC components 3 and 4 is also composed of a plurality of closely spaced leads L extending outwardly from each side of the package along the metal-plated surface PL of the corresponding busbar, downwardly up to the one surface of the package, and outwardly along the metal-plated surface thereof.

The IC component 3 is placed on the busbar assembly BA such that:

a bottom surface of the rectangular package thereof is fixedly mounted on a predetermined located land of the metal-plated surface PL of the busbar 6 by the solder joint 13 located between the bottom surface and the land of the metal-plated surface PL of the busbar 6;

five of the leads L extending from one side of the package of the IC component 3 are fixedly mounted on corresponding predetermined located lands of the metal-plated surface PL of the busbar 11 by the solder joints 13 located between the leads L and the corresponding lands of the metal-plated surface PL of the busbar 6, respectively;

one lead L extending from the other side of the package of the IC component 3 is fixedly mounted on a corresponding predetermined located land of the metal-plated surface PL of the busbar 7 by the solder joint 13 located between the lead L and the corresponding land of the metal-plated surface PL of the busbar 6; and one paired leads L extending from the other side of the package of the IC component 3 are fixedly mounted on corresponding predetermined located lands of the metal-plated surface PL of the busbar 8 by the solder joints 13 located between the paired leads L and the corresponding lands of the metal-plated surface PL of the busbar 8.

The IC component 4 is placed on the busbar assembly BA such that:

a bottom surface of the rectangular package thereof is fixedly mounted on a predetermined located land of the metal-plated surface PL of the busbar 11 by the solder joint 13 located between the bottom surface and the land of the metal-plated surface PL of the busbar 11;

five of the leads L extending from one side of the package of the IC component 4 are fixedly mounted on corresponding predetermined located lands of the metal-plated surface PL of the busbar 12 by the solder joints 13 located between the leads L and the corresponding lands of the metal-plated surface PL of the busbar 12, respectively;

one lead L extending from the other side of the package of the IC component 4 is fixedly mounted on a corresponding predetermined located land of the metal-plated surface PL of the busbar 9 by the solder joint 13 located between the lead L and the corresponding land of the metal-plated surface PL of the busbar 9; and one paired leads L extending from the other side of the package of the IC component 4 are fixedly mounted on corresponding predetermined located lands of the metal-plated surface PL of the busbar 10 by the solder joints 13 located between the paired leads L and the corresponding lands of the metal-plated surface PL of the busbar 10.

Figure 2A:
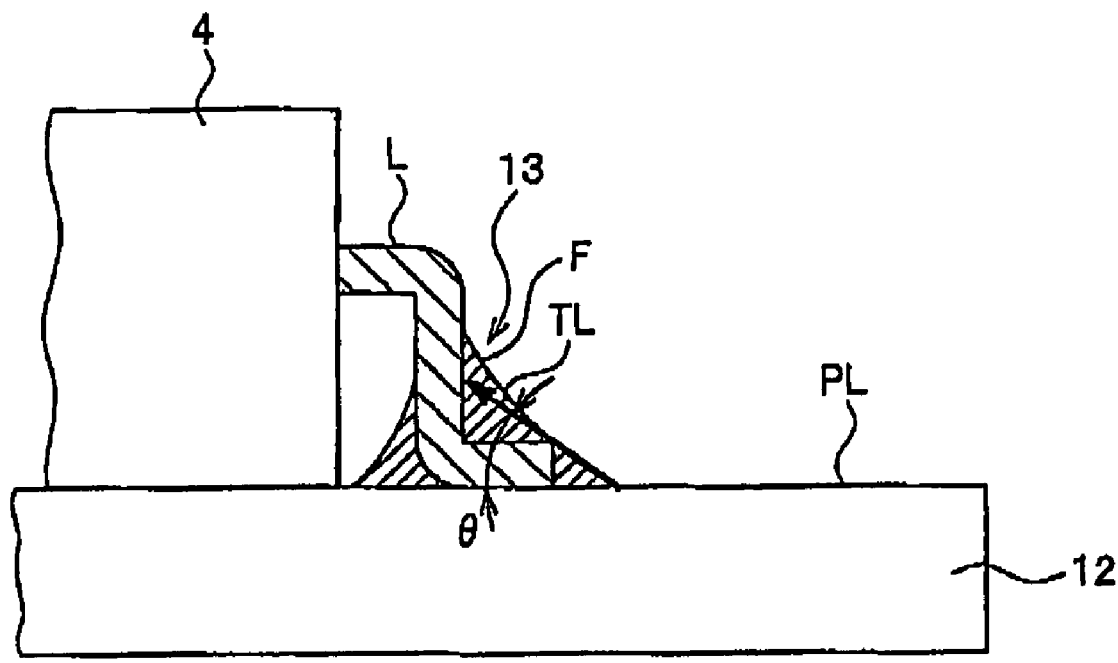
FIG. 2A is a partially cross sectional view schematically illustrating one of leads of an IC component and a molten solder joint located therearound according to the first embodiment.
Figure 2B:
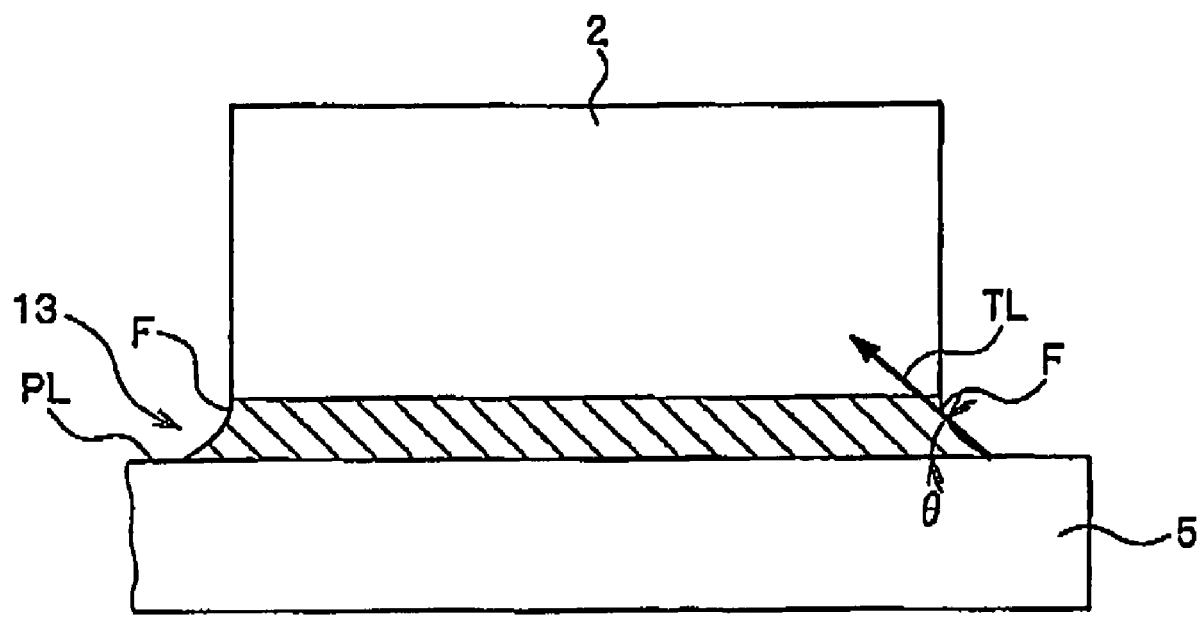
FIG. 2B is a partially cross sectional view schematically illustrating the molten solder joint located between the bottom surface of an IC component and a land of a corresponding busbar illustrated in FIG. 1.

FIG. 2A is a partially cross sectional view schematically illustrating one of the leads L of the IC component 4 and the molten solder joint 13 located therearound. FIG. 2B is a partially cross sectional view schematically illustrating the molten solder joint 13 located between the bottom surface of the IC component 2 and the corresponding land of the busbar 5.

As illustrated in FIGS. 2 and 2B as an example, each of the molten solder joints 13 located around a corresponding one of the leads L or located between the bottom surface of the corresponding package (chip itself and the metal-plated surface PL of the corresponding busbar has a predetermined fillet (solder fillet) SF.

In the first embodiment, the term "fillet" means the configuration of an outer surface of a cross section of each of the molten solder joints 13 orthogonal to the direction of the metal-plated surface PA of the busbar assembly BA.

Generally, the fillet of molten solder between a lead and a land pattern to be joined to each other is used as a first evaluation index to determine whether the solder joint corresponding to the soldering is good or not.

Specifically, when the fillet has a gradually inclined shape like the foot of a mountain, the solder joint corresponding to the fillet is determined to be good.

In addition to the fillet, a second evaluation index to determine whether a solder joint between a lead and a land pattern is good or not is a solder contact angle θ. The solder contact angle θ means an angle between a corresponding fillet of molten solder and the lead or the land pattern. Such a contact angle θ is measured by constructing a line (vector) TL tangential to the solder fillet that passes through a point of origin located at the plane of intersection between the fillet and the lead or the land pattern.

Figure 3:
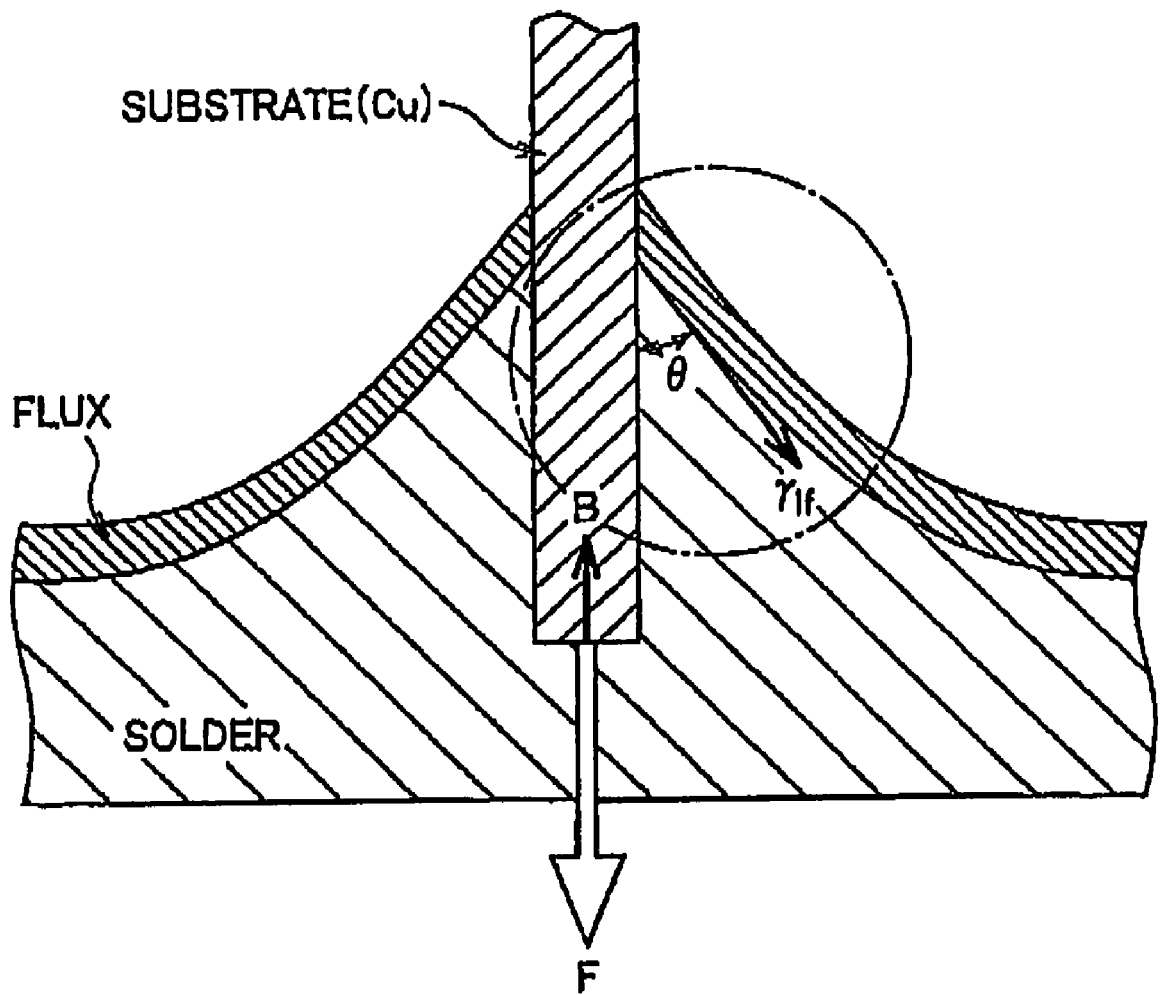
FIG. 3 is a vertical view schematically illustrating a substrate immersed in molten solder using the well-known meniscograph test (JIS C 0053) according to the first embodiment.

The reason why the solder contact angle θ is used as the second evaluation index is that wettability, which is an essential characteristic of a molten solder joint, depends on the solder contact angle θ. FIG. 3 is a vertical view schematically illustrating a substrate immersed in molten solder using the well-known meniscograph test (JIS C 0053). As illustrated in FIG. 3, the wetting force F is given by the following equation:

$$F = P \cdot \gamma_{lf} \cdot \cos\theta - B$$

where P is a perimeter of the substrate, B is a buoyancy force, both of which are known to be constant, θ is a solder contact angle, and a solder-flux interfacial tension $\gamma_{lf}$.

The equation shows that the lower the solder contact angle θ is, the more the wetting force F increases. Thus, in general, the lower the contact angle θ is, the more the solder joint is excellent.

A third evaluation index to determine whether soldering between a lead and a land pattern to be joined to each other is good or not is information of whether a lead outline is visible via the solder joint.

In the first embodiment, however, the second evaluation index cannot directly apply to the solder joints 13 because no solder resist layers are formed on the metal-plated surface PL of the busbar assembly BA. Specifically, an excessively small solder contact angle θ may cause the corresponding molten solder joint to flow out of the corresponding busbar, malting the corresponding fillet to deteriorate.

In view of the first to third evaluation indexes, the inventors of the present application have found that limitation of the solder contact angle θ of each of the molten solder joints 13 within a predetermined angular range of 40 to 60 degrees prevents excessive wicking of a corresponding one of the molten solder joints 13.

Figure 4A:
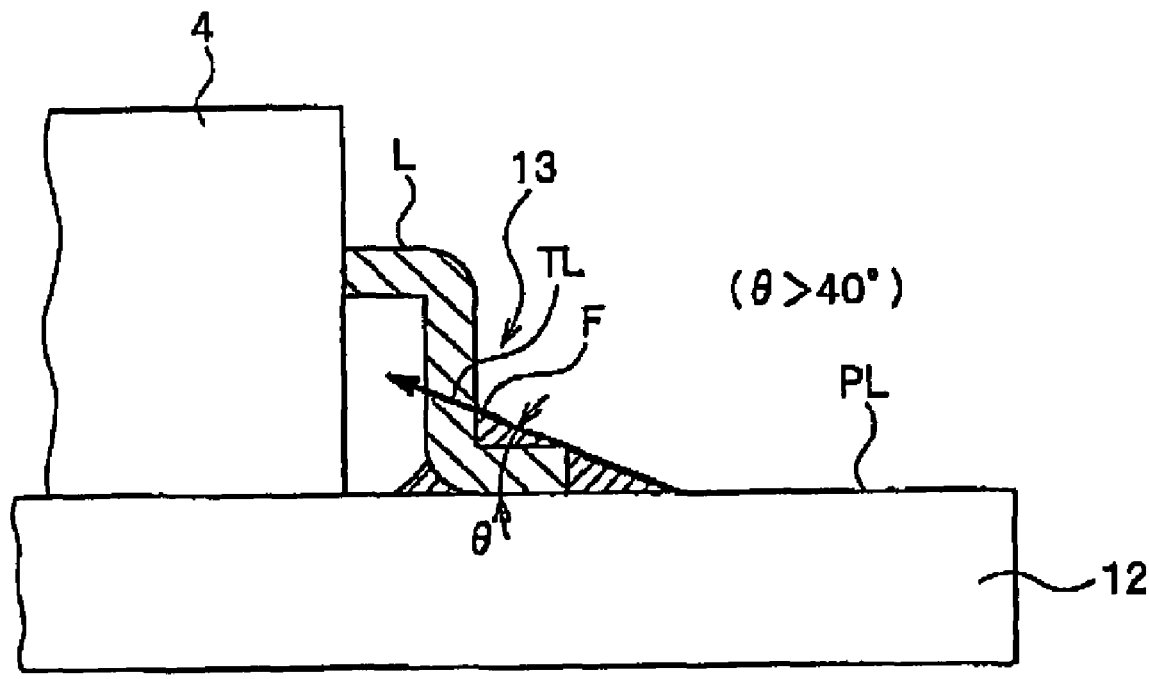
FIG. 4A is a partially cross sectional view schematically illustrating a case where a solder contact angle between a fillet of a corresponding molten solder joint for fixing a lead and a metal-plated surface of a corresponding busbar is set to be lower than 40 degrees according to the first embodiment.

Specifically, FIG. 4A schematically illustrates a case where the solder contact angle θ between the fillet F of the corresponding molten solder joint 13 for fixing a lead L and the metal-plated surface PL of the corresponding busbar 12 is set to be lower than 40 degrees (the lower limit of the angular limitation of the contact angle). In this case, the molten solder joint 13 is excessively traveled from the corresponding busbar 12. This may cause the amount of the molten solder joint 13 on the corresponding busbar 12 to be reduced, which may deteriorate the strength of the solder joint 13.

Figure 4B:
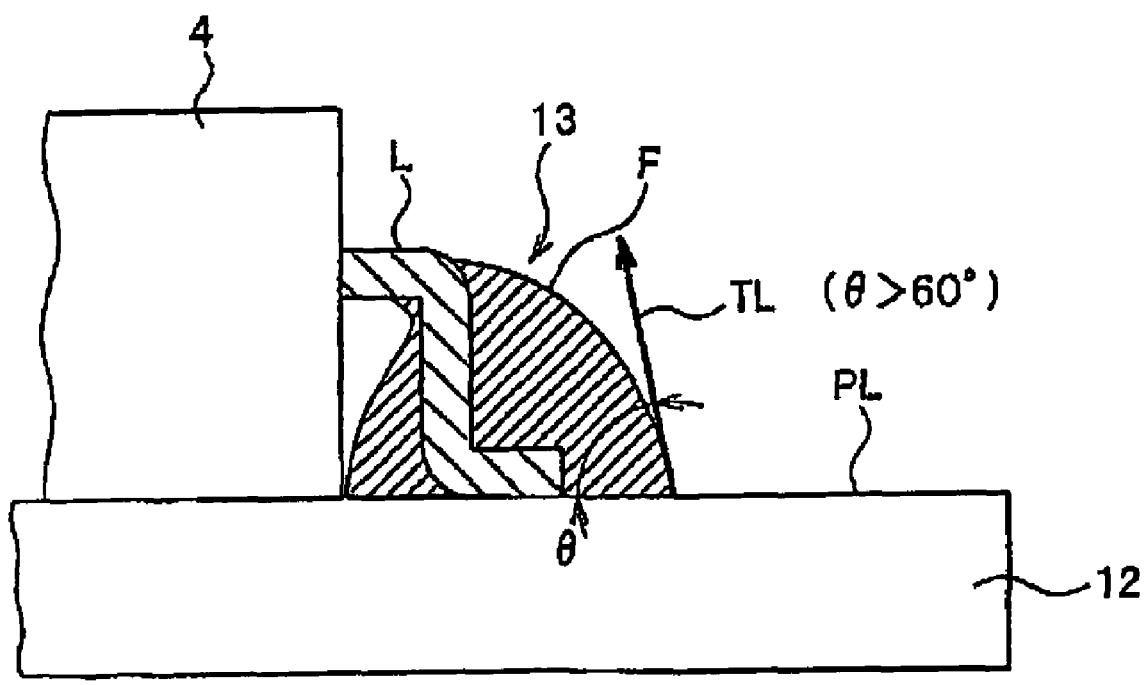
FIG. 4B is a partially cross sectional view schematically illustrating a case where the solder contact angle between the fillet of the corresponding molten solder joint for fixing a lead and the metal-plated surface of the corresponding busbar is set to be higher than 60 degrees according to the first embodiment.

On the other hand, FIG. 4B schematically illustrates another case where the solder contact angle θ between the fillet F of the corresponding molten solder joint 13 for fixing a lead L and the metal-plated surface PL of the corresponding busbar 12 is set to be higher than 60 degrees (the higher limit of the angular limitation of the contact angle). In another case, the molten solder joint 13 is excessively mounted on the corresponding lead L. This may cause the lead outline to be invisible via the solder joint 13, and cause the bending of the corresponding lead L for strain release to be ineffective. As a result, stress may be concentrated on the solder joint 13, causing the IC component 4 to break down.

As described above, in the first embodiment, adjustment of the solder contact angle θ of each of the molten solder joints 13 to be within the angular range of 40 to 60 degrees can maintain the fillet of a corresponding one of the molten solder joints 13 in an excellent configuration of gradually inclined like the foot of a mountain.

Note that the contact angle θ of one molten solder joint 13 located on the metal-plated surface PL of the corresponding busbar depends on the alloyed materials of the one solder joint 13 and on the metal material (alloyed material) of the plated layer PL of the busbar assembly BA.

In order to determine which solder alloys to be used as the solder joint 13, and which metal material (alloyed material) to be used as the plated layer PL, the inventors of the present invention prepared thirteen different tin(Sn)-based lead(Pb)-free solder alloys and two tin-based Pb solder alloy (twenty different samples).

FIGS. 5A and 5B illustrating the measured result of each of the twenty different samples are disclosed in the following nonpatent literature:

"*Characteristics evaluation of Pb free solder alloys (1)— Melting properties and wettability*—in 3rd Symposium on "Microjoining and Assembly Technology in Electronics" Feb. 6-7, 1997, Yokohama Specifically, as illustrated in FIG. 5A, the sample No. 1 is an alloy of Sn-silver(Ag), the sample No. 2 is an alloy of Sn-copper(Cu), the samples No. 3 and No. 4 are respectively alloys of Sn—Ag—Cu, and the sample No. 5 is an alloy of Sn—Ag-bismuth(Bi). The samples No. 6 and No. 7 are respectively alloys of Sn—Ag—Bi—Cu, the samples No. 8, No. 9, No. 10, and No. 11 are respectively alloys of Sn—Ag—Bi-indium(In), the sample No. 12 is an alloy of Sn—Ag—In—Cu, and the sample No. 13 is an alloy of Sn—Bi—Cu.

The sample No. 14 is an alloy of Sn—Bi—In—Cu, the sample No. 15 is an alloy of Sn—Ag-zinc(Zn), the sample No. 16 is an alloy of Sn—Zn, and the sample No. 17 is an alloy of Sn—Zn—Bi. The sample No. 18 is an alloy of Sn—Zn—In, the sample No. 19 is an alloy of Sn—Ag—Bi—Pb, and the sample No. 20 is an alloy of Sn—Pb.

After the preparation of the samples No. 1 to No. 20 of solder alloys, the inventors of the present invention measured the contact angle θ (degrees) of each of the samples No. 1 to No. 20 of solder alloys using the well-known meniscograph test illustrated in FIG. 3.

FIG. 5B schematically illustrates the measurement result.

Specifically, in FIG. 5B, (a) illustrates the measured contact angle θ (degrees) of each of the samples No. 1 to No. 20 when the temperature (reflow temperature) in a corresponding one of the samples No. 1 to No. 20 is kept at 250° C. In FIG. 5B, (b) illustrates the measured contact angle θ (degrees) of each of the samples No. 1 to No. 20 when the temperature (reflow temperature) in a corresponding one of the samples No. 1 to No. 20 of solder alloys is kept at the sum of liquidus temperature thereof and 50° C.

Note that, in (a) of FIG. 5B, reproducible data corresponding to the sample No. 15 cannot be obtained due to the oxidation process, and therefore it has been omitted in illustration.

As clearly illustrated in FIGS. 5A and 5B, the contact angle θ of each of the samples No. 1 to No. 14 of the nine different Sn-based Pb-free solder alloys and the sample No. 19 of the one Sn-based solder containing lead substantially lies in an angular range of 30 to 40 degrees. The contact angle θ of each of the samples No. 15 to 18 of the three different Sn-based Pb-free solder alloys substantially lies within the angular range of 40 to 60 degrees.

In contrast, the contact angle θ of the sample No. 20 of the Sn—Pb solder alloy substantially lies in an angular range of 10 degrees and thereabout out of the angular range of 40 to 60 degrees.

The actual contact angle θ of the molten solder with respect to the one surface of each of the busbars 5 to 12 depends on the metal material of the plating of the one surface of a corresponding one of the busbars 5 to 12.

For this reason, the actual contact angle θ of the molten solder with respect to the one surface of each of the busbars 5 to 12 is greater than the contact angle θ of each of the samples in the meniscograph test.

Thus, in the first embodiment, any one of the samples No. 1 to No. 14 of the nine different Sn-based Pb-free solder alloys is preferably selected as the solder alloy of each of the solder joints 13. Specifically, in the first embodiment, the sample No. 3 or No. 4 of an alloy of Sn—Ag—Cu is selected as the solder alloy of each of the solder joints 13.

As set forth above, a fourth evaluation index to determine whether a solder joint between a lead and a land pattern is good or not is information representing which metals (alloys) to be used as the plating of the one surface of each of the busbars 5 to 12.

Assuming that the thickness of the plating of the one surface of each of the busbars 5 to 12 is constant, the typical metal materials for the plating, such as a nickel(Ni), an alloy of Ni-phosphorus(P), a palladium(Pd), an alloy of gold (Au)—Pd—Ni, an Sn, an alloy of Sn—Ag, an Ag, an alloy of Ni—Au, and an Au, are dependent on the wettability of molten solder. Note that the thickness of the plating of the one surface of each of the busbars 5 to 12 depends on the wettability of the molten solder on the one surface of a corresponding one of the busbars 5 to 12.

Specifically, the wettability of the molten solder in a case of using the Ni or the alloy of Ni—P as the plating of the one surface of each of the busbars 5 to 12 is lower than that of the molten solder in a case of using the Pd or the alloy of Au—Pd—Ni.

The wettability of the molten solder in a case of using the Pd or the alloy of Au—Pd—Ni as the plating of the one surface of each of the busbars 5 to 12 is lower than that of the molten solder in a case of using the Sn, the alloy of Sn—Ag, or Ag. The wettability of the molten solder in a case of using the Sn, the alloy of Sn—Ag, or Ag as the plating of the one surface of each of the busbars 5 to 12 is lower than that of the molten solder in a case of using the Sn, the alloy of Ni—Au or Au.

Specifically, for example, selecting one of the typical metal materials to be used as the plating of the one surface of each of the busbars 5 to 12 allows the contact angle θ of the molten solder with respect to the one surface of a corresponding at least one of the busbars 5 to 12 to be controlled, thus stably maintaining the contact angle θ thereof with respect to the one surface of a corresponding at least one of the busbars 5 to 12 within the angular range of 40 degrees to 60 degrees.

Specifically, before the selection, the inventors of the present invention measured the contact angle θ (degrees) and the fillet of molten solder alloy of Sn—Ag—Cu in accordance with the well-known meniscograph test illustrated in FIG. 3 by immersing:

(1) a nickel(Ni) plated substrate in the molten solder alloy of Sn—Ag-Cn as a first example;

(2) a nickel-phosphorus plated substrate in the molten solder alloy of Sn—Ag-Cn as a second example;

(3) an Sn plated substrate in the molten solder alloy of Sn—Ag-Cn as a third example; and (4) a nickel-gold(Au) plated substrate in the molten solder alloy of Sn—Ag-Cn as a fourth example.

FIG. 6 schematically illustrates the result of measurement of each of the first to fourth examples.

As illustrated in FIG. 6, the measured fillet corresponding to each of the third and fourth examples has a bad shape, and the measured contact angle θ corresponding thereto is out of the angular range of 40 to 60 degrees.

Especially, in the third example, the tin(Sn) is molten, and, in the fourth example, the Ni—Ag plate is comparatively high in cost. Thus, for the reasons set forth above, using the tin(Sn) or an alloy of Ni—Ag as the plating of the one surface of each of the busbars 5 to 12 is determined to be improper.

In contrast, as illustrated in FIG. 6, the measured fillet corresponding to each of the first and second examples has an excellent shape, such as a gradually inclined shape like the foot of a mountain, and the measured contact angle θ corresponding thereto lies within an angular range of 40 to 45 degrees.

Especially, the nickel plate is comparatively low in cost and has a comparatively high weldabilty in a post process, and therefore, using the nickel(Ni) as the metal material of the plating of the one surface of each of the busbars 5 to 12 is determined to be proper.

Specifically, the coefficient of spread of a solder bump mounted on a copper plate is normally greater than that of a solder bump mounted on, for example, a nickel-plated plate, and therefore, the contact angle of a molten solder with respect to the nickel-plated plate is greater than that of a molten solder with respect to a copper plate.

The inventors measured the coefficient of spread of each of the solder samples 1, 3 to 12, and 14 assumed to have a substantially spherical shape using the meniscograph test. Specifically, the coefficient of spread of each of the solder samples 1, 3 to 12, and 14 is given by the following equation defined by JIS Z3197:

$$CS(\%) = 100 \times (D-H)/D$$

where CS represents a coefficient of spread of each of the solder samples (solder bumps), D represents the diameter of each of the solder samples before the meniscograph test, and H represents the height of each of the solder samples after the meniscograph.

As a result, the respective coefficients of spread of the solder samples deposited on a copper solder plate with no metal plating lie within the range of 80 to 82(%).

In contrast, the respective coefficients of spread of the solder samples deposited on a nickel-plated plate lie within the range of 59 to 65(%).

The range of 80 to 82(%) with which respective coefficients of spread of the solder samples deposited on the copper solder plate with no metal plating lie can be converted to a range of 32.8 to 34.6 degrees within which the corresponding contact angles of the solder samples lie.

In contrast, the range of 59 to 65(%) within which respective coefficients of spread of the solder samples deposited on the nickel-plated plate lie can be converted to a range of 49.1 to 55.0 degrees within which the corresponding contact angles of the solder samples lie.

Accordingly, the nickel-plated layer can adjust the contact angles of the solder samples 1, 3 to 12, and 14 to be lied within the angular range of 40 to 60 degrees.

As set fourth above, in the first embodiment, as the metal-plated layer, a nickel-plated layer PL is selected to be formed on the one surface of each of the busbars 5 to 12.

As described above, in the first embodiment, adjustment of the solder alloy of each of the solder joint 13 and that of the metal material of the metal-plated layer PL covering the one surface of the busbar assembly BA allow the solder contact angle θ of each of the molten solder joints 13 to be within the angular range of 40 to 60 degrees. This makes it possible to maintain the fillet of each of the molten solder joints 13 in an excellent configuration of gradually inclined like the foot of a mountain, reliably ensuring adequate strength of each of the solder joints 13.

Next, an example of method of manufacturing the electronic apparatus 1 will be described hereinafter.

As illustrated in FIG. 7, a busbar plate 20 is prepared at a first process of the manufacturing method.

The busbar plate 20 is made up of the busbars 5 to 12 before bending and of a plurality of link bars 21 to 34. The link bar 21 links the one lateral end 5a of the busbar 5 and the rectangular part 6a of the busbar 6, and the link bar 22 links the tip end of the extending portion 5b of the busbar 5 and the tip end of the extending portion 6c of the busbar 6.

The link bar 23 links the adjacent terminals 14 and 15, the link bar 24 links the rectangular part 6a of the busbar 6 and the busbar 11, and the link bar 25 links the tip end of the extending portion 6c of the busbar 6 and the one lateral end 7a of the busbar 7.

The link bar 26 links the adjacent terminal bars 15 and 16, the link bar 27 links the one lateral end 7a of the busbar 7 and the one lateral end 8a of the busbar 8, and the link bar 28 links the adjacent terminal bars 16 and 17.

The link bar 29 links the one lateral end 8a of the busbar 8 and the one lateral end 9a of the busbar 9, and the link bar 30 links the adjacent terminal bars 17 and 18.

The link bar 31 links the one lateral end 9a of the busbar 9 and 26 the one lateral end 10a of the busbar 10, and the link bar 32 links the adjacent terminal bars 18 and 19.

The link bar 33 links the one lateral end 10a of the busbar 10 and one lateral end of the second rectangular part 11b of the busbar 11. The link bar 34 links the one lateral end 11d of the busbar 11, the one lateral end of the busbar 12, and the other lateral end of the second rectangular part 11b of the busbar 11.

For example, a substantially copper plate having one surface with which the nickel-plated layer PL is coated is pressed to form the busbar plate 20.

Figure 8:
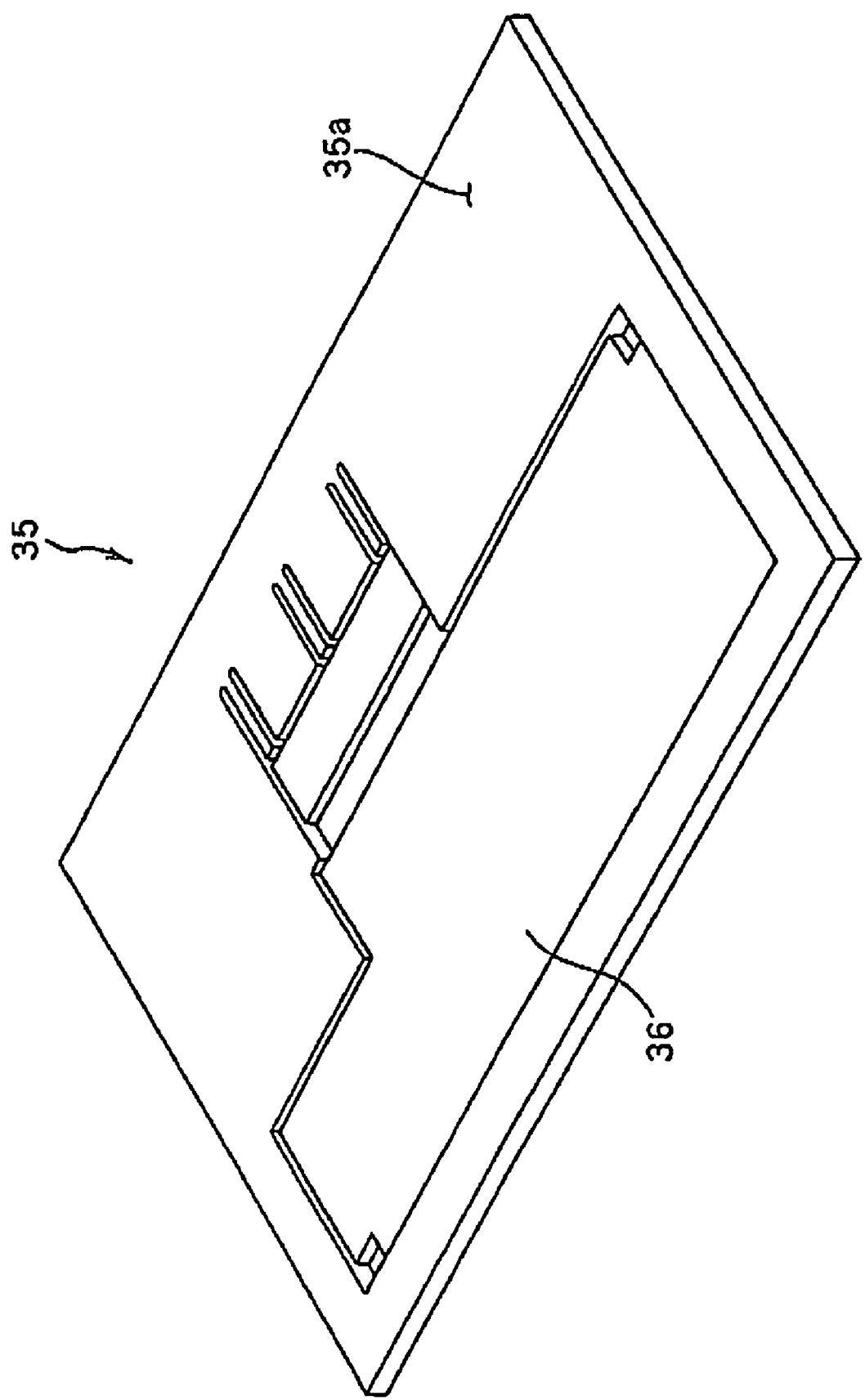
FIG. 8 is a perspective view schematically illustrating an example of the structure of a plate like jig according to the first embodiment.

Next, at a second process of the manufacturing method, a plate lie jig 35 having one surface 35a whose area is greater than that of the nickel-plated surface PL of the busbar plate 20 is prepared (see FIG. 8).

The jig 35 is formed with a concave groove 36 in the one surface 35a thereof. The outline of the concave groove 36 coincides with that of the busbar plate 20, which allows the busbar plate 20 to be installed in the concave groove 36.

Figure 9:
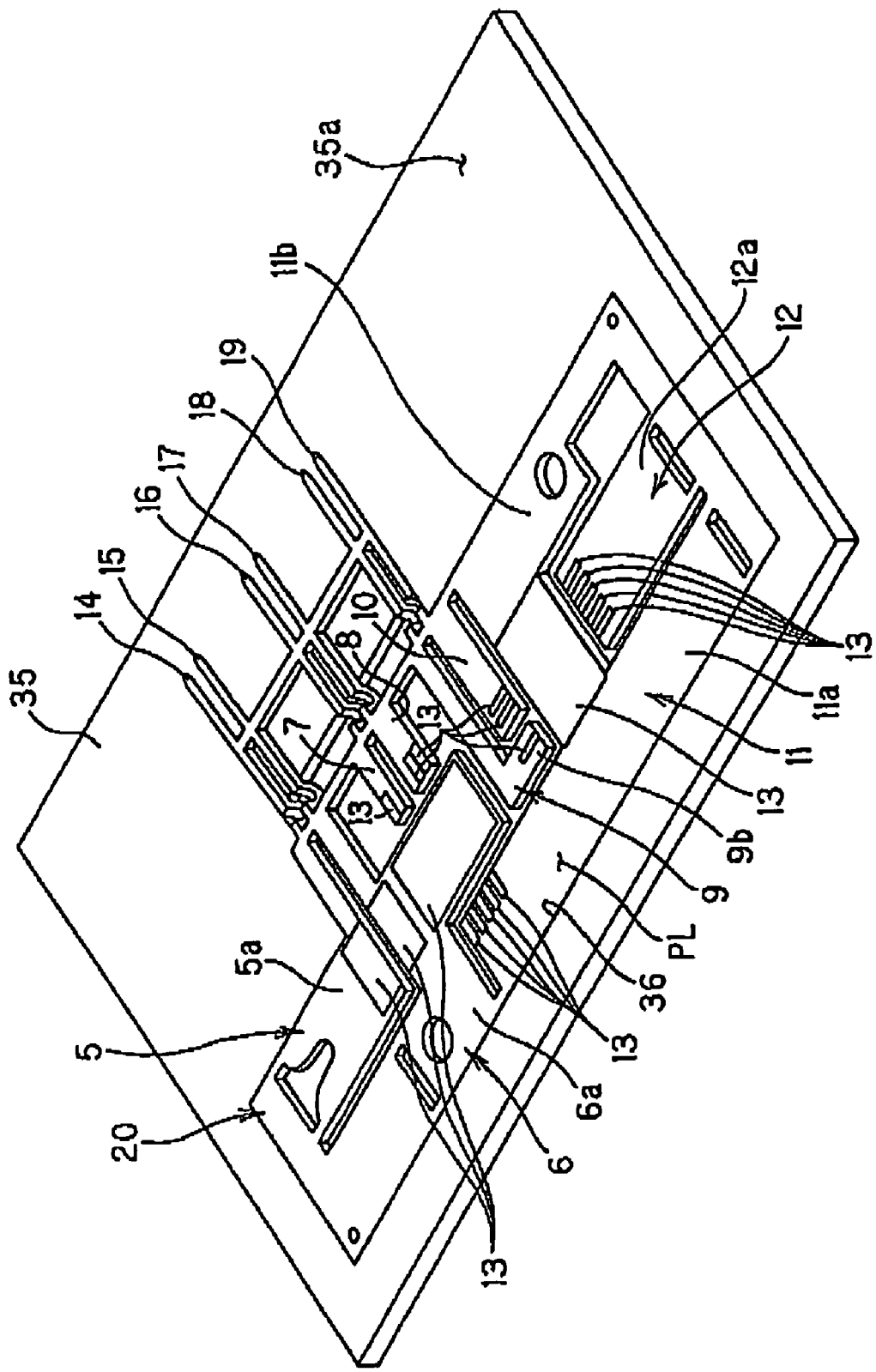
FIG. 9 is a perspective view schematically illustrating a state in which the busbar plate is installed in the jig according to the first embodiment.

Next, at a third process of the manufacturing method, as illustrated in FIG. 9, the busbar plate 20 is installed in the concave groove 36 of the jig 35.

Thereafter, solder-paste bumps 13, each of which is a cream-like mixture of solder alloy powder and flux, is deposited on at least one predetermined located land of the nickel-plated surface PL of at least some of the busbars 5 to 12.

Note that the amount of the flux contained in each of the solder-paste bumps 13 has a function of removing oxides on the nickel-plated surface PL of the busbar assembly BA, and therefore, has much effect on the wettability thereof. Reduction of the amount of the flux contained in each of the solder-paste bumps 13 allows control of the wettability thereof.

However, reduction of the amount of the flux contained in each of the solder-paste bumps 13 may inadequately remove oxides on the nickel-plated surface PL of the busbar assembly BA. For this reason, in the first embodiment, the solder alloy of each of the solder-paste bumps 13 and that of the metal material of the metal-plated layer PL covering the one surface of the busbar assembly BA are adjusted while the amount of flux contained in each of the solder-paste bumps 13 is constant so as to allow the solder contact angle θ of each of the molten solder-paste bumps 13 to be within the angular range of 40 to 60 degrees.

Specifically, two of the solder-paste bumps 13 are deposited on the other lateral end of the busbar 5 and on the one lateral end of the second rectangular part 6b of the busbar 6 adjacent thereto. One of the solder-paste bumps 13 is deposited on the substantially remaining section of the second rectangular part 6b of the busbar 6.

Five of the solder-paste bumps 13 are so deposited on the other lateral end of the first rectangular part 11a of the busbar 11. The five of the solder-paste bumps 13 are so aligned along one longitudinal side of the second rectangular part 6b of the busbar 6 as to be closely spaced from each other. One of the solder-paste bump 13 is deposited on the other lateral end of the busbar 7, and two thereof are deposited on the other lateral end of the busbar 8.

One of the solder-paste bumps 13 is deposited on the third rectangular part 11c of the busbar 11. One of the solder-paste bumps 13 is deposited on the other lateral end 9b of the busbar 9, and two thereof are deposited on the other lateral end of the busbar 10. Five of the solder-paste bumps 13 are deposited on the other lateral end of the busbar 12.

Figure 10:
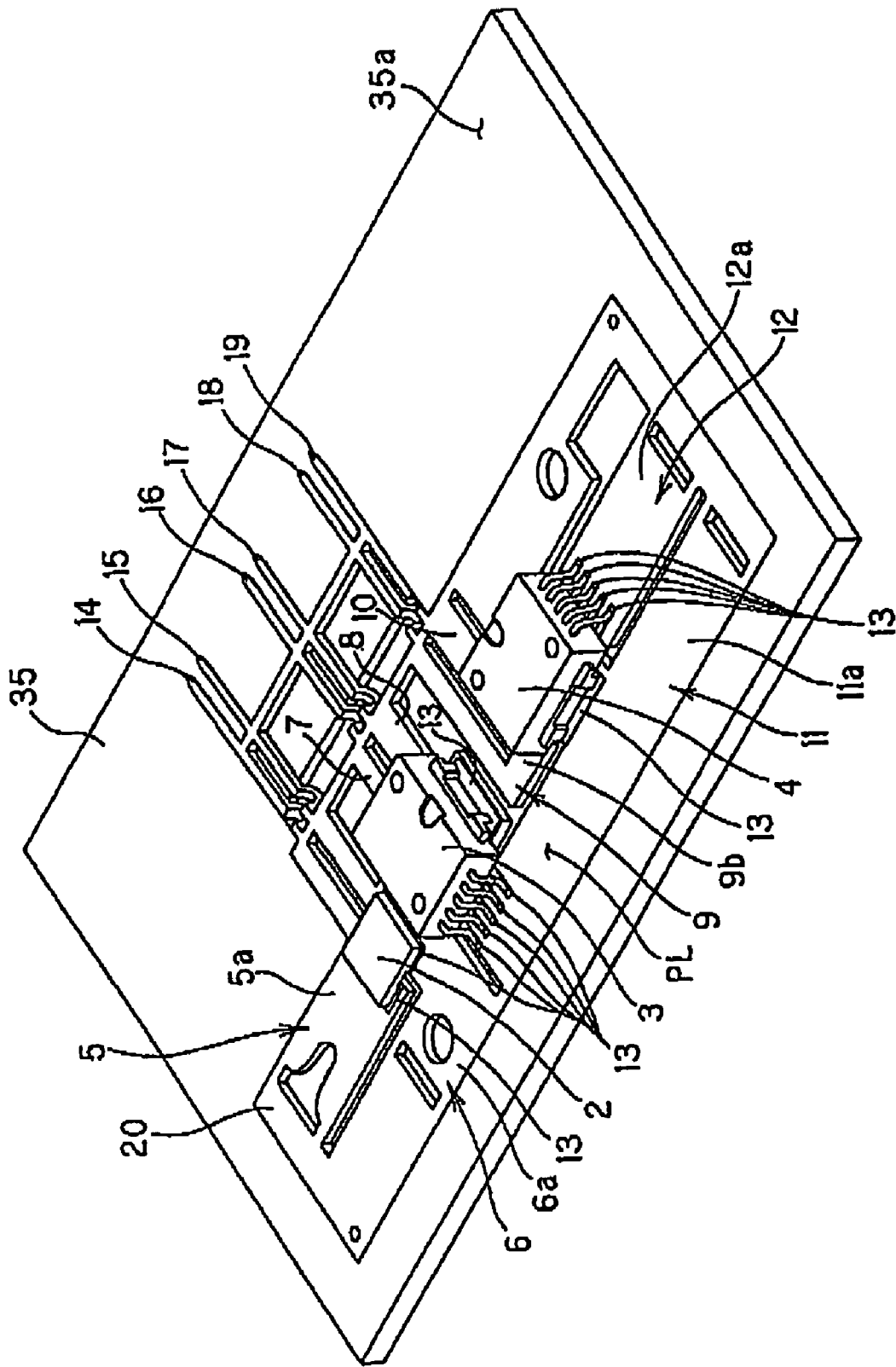
FIG. 10 is a perspective view schematically illustrating a state in which IC components are mounted on the busbar plate according to the first embodiment.

Next, at a fourth process of the manufacturing method, as illustrated in FIG. 10, the IC component 2 is mounted at its bottom surface on the solder-paste bumps 13 located on the other lateral end of the busbar 5 and on the one lateral end of the second rectangular part 6b of the busbar 6.

The IC component 3 is mounted at its bottom surface of the rectangular package thereof on the solder-paste bump 13 located on the substantially remaining section of the second rectangular part 6b of the busbar 6. At the same time, five of the leads L extending from the one side of the package of the IC component 3 are respectively mounted on corresponding solder-paste bumps 13 located on the other lateral end of the first rectangular part 11a of the busbar 11. Similarly, three of the leads L, extending from the other side of the package of the IC component 3 are respectively mounted on corresponding solder-paste bumps 13 located on the other lateral ends of the busbars 7 and 8.

The IC component 4 is mounted at its bottom surface of the rectangular package thereof on the solder-paste bump 13 located on the third rectangular part 11c of the busbar 11. At the same time, five of the leads L extending from the one side of the package of the IC component 4 are respectively mounted on corresponding solder-paste bumps 13 located on the other lateral end of the busbar 12. Similarly, three of the leads L extending from the other side of the package of the IC component 4 are respectively mounted on corresponding solder-paste bumps 13 located on the other lateral ends of the busbars 9 and 10.

Thereafter, at a fifth process of the manufacturing method, the busbar plate 20 on which the IC components 2 to 4 are mounted via the solder-paste bumps 13 is placed into a reflow oven together with the jig 35. In the reflow oven, each of the solder-paste bumps 13 on a corresponding one of the lands of the busbars 5 to 12 is reflowed (melted), and thereafter, solidified (reformed).

The solidification (reformation) of the melted solder-paste bumps 13 allows the electronic components 2 to 4 to be fixedly mounted on the nickel-plated surface PL of the corresponding busbars by the corresponding solder joints 13.

In the first embodiment, as described above, adjustment of the solder alloy of each of the solder-paste bumps 13 and that of the metal material of the metal-plated layer PL covering the one surface of the busbar assembly BA allow the solder contact angle θ of each of the molten solder-paste bumps 13 to be within the angular range of 40 to 60 degrees. This makes it possible to prevent each of the molten solder-paste bumps 13 on the metal-plated surface PL of the corresponding some of the busbars 5 to 12 from being excessively traveled, thus reliably soldering the electronic components 2 to 4 to the corresponding some of the busbars 5 to 12.

Figure 11:
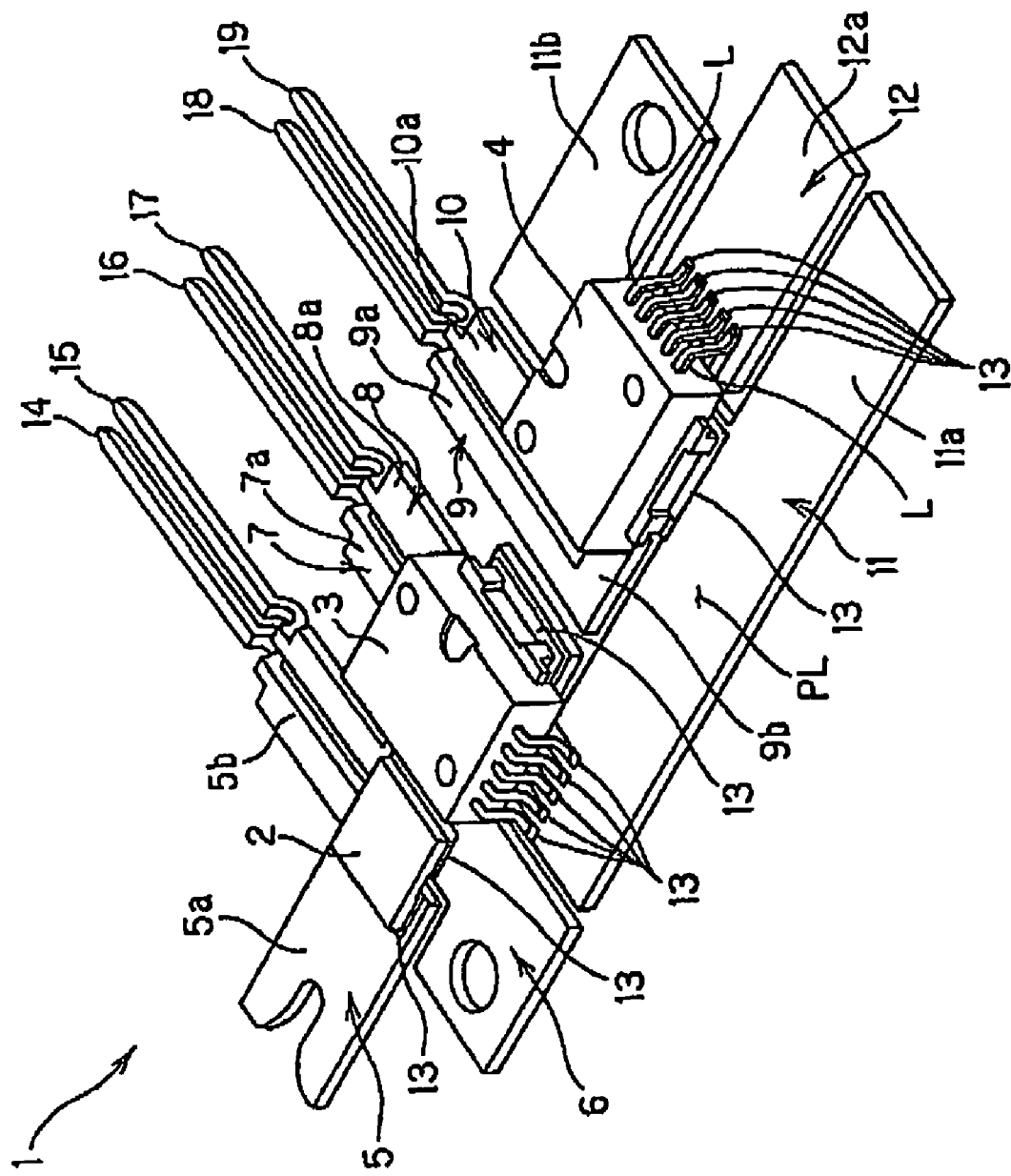
FIG. 11 is a perspective view schematically illustrating a state in which the busbar plate is cut away from the jig and link bars are removed from the busbar plate according to the first embodiment.

After the fifth process (soldering process) of the manufacturing method, the busbar plate 20 is cut away from the jig 35, and the link bars 21 to 34 are removed from the busbar plate 20 (see FIG. 11).

Thereafter, the one lateral end 5a, one lateral end 11d, and one lateral end 12a of the rectangular busbars 5, 11, and 12 are orthogonally bent toward the plated-layer sides thereof, respectively. Similarly, the terminal bars 14, 15, 16, 17, 18, and 19 are orthogonally bent toward the plated-layer sides of the busbars 5, 6, 7, 8, 9, and 10, respectively. This results in that the electronic apparatus 1 illustrated in FIG. 1 is completed.

As described above, in the electronic apparatus 1 according to the first embodiment, the alloy of Sn—Ag—Cu is selected as the solder alloy of each of the solder joints (solder-paste bumps) 13 and the nickel is selected as the metal material of the plating of the one surface of the busbar assembly BA. These selections allow the solder contact angle θ of each of the molten solder joints 13 to be within the angular range of 40 to 45 degrees. This makes it possible to maintain the fillet of each of the molten solder joints 13 in an excellent configuration of gradually inclined like the foot of a mountain, reliably ensuring adequate strength of each of the solder joints 13.

The electronic components 2, 3, and 4 are therefore reliably soldered to the corresponding some of the busbars 5 to 12 by soldering without forming solder-resist layers thereon while keeping low the cost of manufacturing the electronic component 1.

In addition, the electronic apparatus 1 can be manufactured using the busbar plate 20 consisting of the busbars 5 to 12 before bending and of a plurality of link bars 21 to 34. The link bars 21 to 34 are removed from the busbar plate 20 after the electronic components 2 to 4 are each mounted on the corresponding some of the originally provided busbars 5 to 12 by soldering. This allows each of the electronic components 2 to 4 to be efficiently soldered on corresponding some of the busbars 5 to 12.

The terminal bars 14 to 19 are bent at right angles toward the plated-layer sides of the busbars 5 to 10, respectively, after the electronic components 2 to 4 are each soldered on the corresponding some of the busbars 5 to 12. For this reason, the busbar plate 20 is kept in flat state after completion of the fifth process (soldering process).

This can manufacture the electronic apparatus 1 with the use of squeegee-print and/or component-mount on the flat busbar plate 20 supported by the jig 35; these squeegee print and component-mount on the flat busbar plate 20 are commonly usable to manufacture normal printed boards. It is possible to therefore manufacture the electronic apparatus 1 with the use of installations for mounting electronic components on normal printed boards without any modification.

The electronic apparatus 1 according to the first embodiment can be directly connected to external apparatuses via the terminal bars 14 to 19.

Second Embodiment

Referring to FIGS. 12 to 19, an electronic apparatus 37 according to a second embodiment of the present invention consists of:
a busbar assembly BA1;
a plurality of, such as three, IC components 38, 39, and 40 as electronic components according to the second embodiment; and
a plurality of solder joints 49 between the IC components 38, 39, and 40 to the busbar assembly BA1.

The busbar assembly BA1 is composed of a plurality of busbars 41 to 48 made of a copper as an example of conductive metals for carrying high electric currents.

Figure 12:
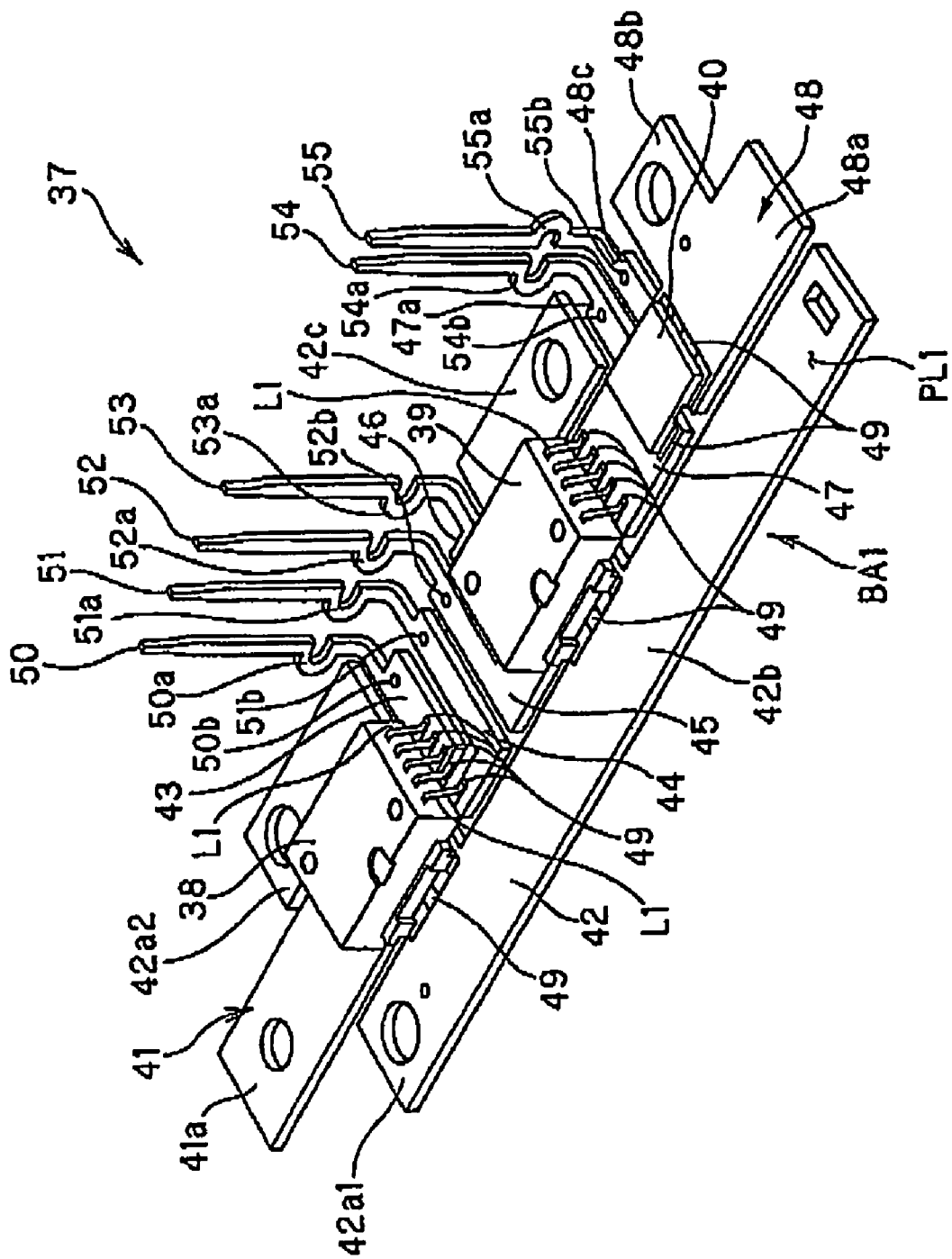
FIG. 12 is a perspective view schematically illustrating an example of the structure of a busbar plate according to a second embodiment of the present invention.

As illustrated in FIG. 12, the plurality of busbars 41 to 48 each having a predetermined shape are arranged on a same plane to be assembled to each other to provide a substantially rectangular wiring board constituting a predetermined circuit pattern.

One surface of each of the busbars 41 to 48 is coated with a nickel-plated layer PL1 like the first embodiment.

No solder-resist layers (resin layers) are formed on the nickel-plated surface PL1 of each of the busbars 41 to 48.

Figure 13:
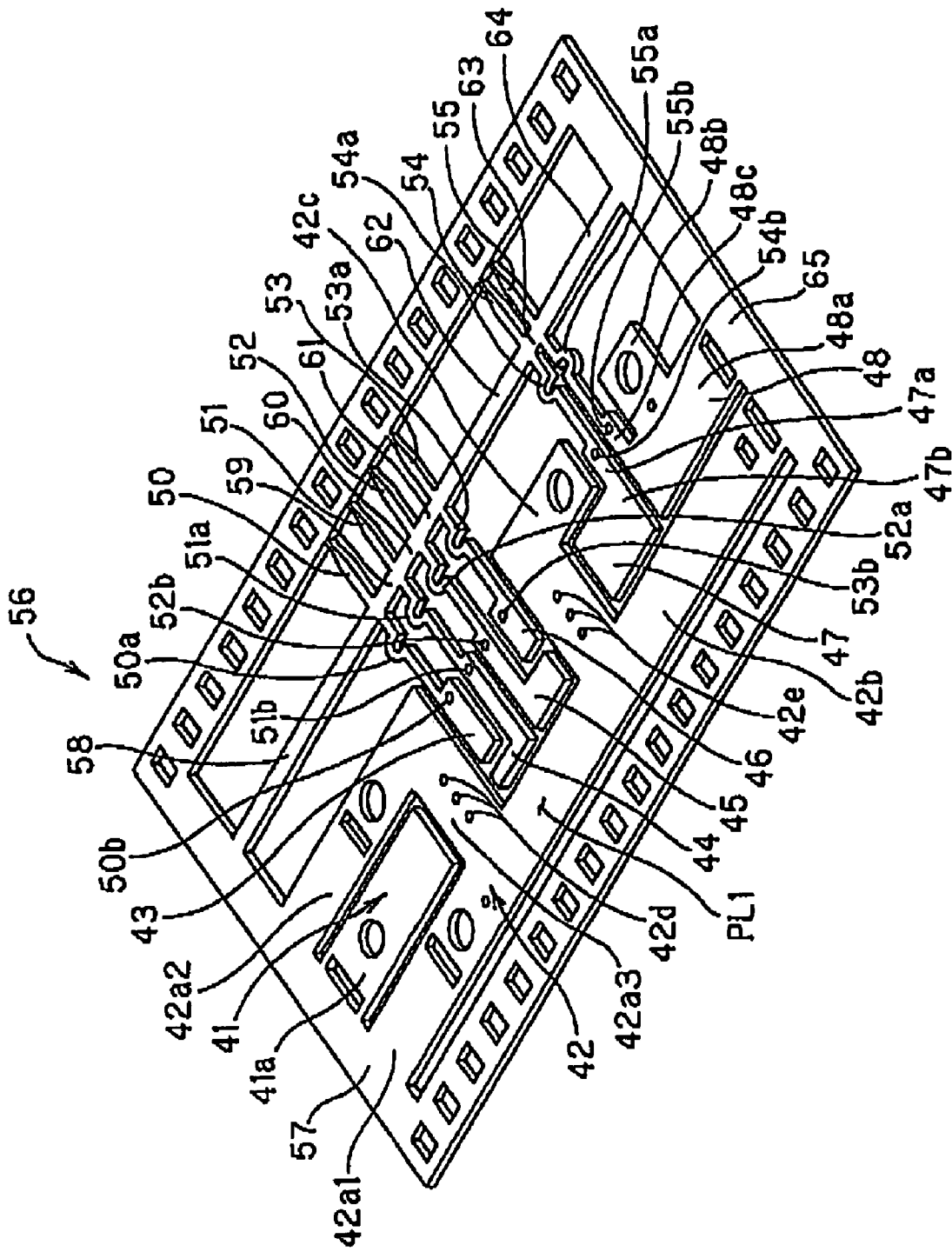
FIG. 13 is a perspective view schematically illustrating an example of the structure of a busbar plate according to the second embodiment.

For example, as illustrated in FIGS. 12 and 13, one lateral end 41a of the rectangular busbar 41 and ends of paired legs 42a1 and 42a2 of a concave part of the busbar 42 constitute one lateral end of the rectangular busbar assembly BA1. A rectangular part 42b of the busbar 42 extending from a substantially rectangular base 42a3 of the concave part thereof constitutes one longitudinal end of the rectangular busbar assembly BA1.

One lateral end of the rectangular part 42b of the busbar 42 and one lateral end of the rectangular part 48a of the busbar 48 constitute the other lateral end of the rectangular busbar assembly BA1.

The leg 42a2 of the busbar 42, and respective one lateral ends of the busbars 43, 44, 45, and 46 are aligned with each other to constitute part of the other longitudinal end of the rectangular busbar assembly BA1.

An end of an L-shaped part 42c extending from the middle of the rectangular part 42b and one end 47a projecting from a square part 47b of the busbar 47 are aligned with each other to constitute another part of the other longitudinal end of the rectangular busbar assembly BA1. A first part 48b projecting from the rectangular part 48a and a second part 48c adjacent to the first part 48b and projecting from the rectangular part 48a thereof are substantially aligned with each other to constitute the other longitudinal end of the rectangular busbar assembly BA1.

To the one lateral ends of the busbars 43 to 46, the one end 47a of the busbar 47, and the second part 48c of the busbar 48, terminal bars 50 to 33, 54, and 55 are continuously formed. The terminal bars 50 to 55 are orthogonally bent toward the plated-layer sides of the corresponding busbars 43 to 48, respectively.

The IC component 40 is designed as, for example, a bare chip component. The IC component 40 is composed of an IC chip and a plurality of leads located on a bottom surface of the IC chip.

The IC component ac chip) 40 is fixedly mounted at its bottom surface on a predetermined located land of the metal-plated surface PL of the busbar 47 and that of the busbar 48 by the solder joints 49 located between the bottom surface of the IC component 40 and the lands of the busbars 47 and 48.

Each of the IC components 38 and 39 is designed as, for example, a small-outline packaged component. Each of the IC components 38 and 39 is composed of an IC chip and a rectangular package encapsulating it.

Each of the IC components 38 and 39 is also composed of a plurality of closely spaced leads L1 extending outwardly from each side of the package along the metal-plated surface PL1 of the corresponding busbar, downwardly up to the one surface of the package, and outwardly along the metal-plated surface thereof.

The IC component 38 is placed on the busbar assembly BA1 such that:
a bottom surface of the rectangular package thereof is fixedly mounted on a predetermined located land of the metal-plated surface PL1 of each of the busbars 41 and 42 by the solder joint 49 located between the bottom surface and the land of the metal-plated surface PL1 of each of the busbars 41 and 42;

five of the leads L1 extending from one side of the package of the IC component 38 are fixedly mounted on corresponding predetermined located lands of the metal-plated surface PL1 of the busbars 43 and 44 by the solder joints 49 located between the leads L1 and the corresponding lands of the metal-plated surface PL1 of the busbars 43 and 44, respectively; and five of the leads L1 extending from the other side of the package of the IC component 38 are fixedly mounted on corresponding predetermined located lands of the metal-plated surface PL1 of the busbar 41 by the solder joint 49 located between the leads L1 and the corresponding lands of the metal-plated surface PL1 of the busbar 41.

The IC component 39 is placed on the busbar assembly BA1 such that:

a bottom surface of the rectangular package thereof is fixedly mounted on a predetermined located land of the metal-plated surface PL1 of the busbar 42 by the solder joint 49 located between the bottom surface and the land of the metal-plated surface PL1 of the busbar 42;

five of the leads L1 extending from one side of the package of the IC component 39 are fixedly mounted on corresponding predetermined located lands of the metal-plated surface PL1 of the busbar 47 by the solder joints 49 located between the leads L1 and the corresponding lands 47 of the metal-plated surface PL1 of the busbar 47; and five of the leads L1 extending from the other side of the package of the IC component 39 are fixedly mounted on corresponding predetermined located lands of the metal-plated surface PL1 of the busbars 45 and 46 by the solder joints 49 located between the leads L1 and the corresponding lands of the metal-plated surface PL1 of the busbars 45 and 46.

The terminal bars 50 to 55 are formed with substantially U-shaped bent portions 50a to 55a located between the orthogonally bent portions and tip ends thereof, respectively. The U-shaped bent portions 50a to 55a project toward the one lateral side of the busbar assembly BA1 orthogonal to the direction of a thickness between the one surface and the other surface opposing the one surface.

The one lateral ends of the busbars 43 to 46 are formed with small fitting holes 50b to 53b penetrated therethrough in their thickness directions, respectively. Similarly, the one end 47a projecting from the square part 47b of the busbar 47 and the second part 48c projecting from the rectangular part 48a of the busbar 48 are formed with small fitting holes 54b and 55b penetrated therethrough in their thickness directions, respectively.

In the second embodiment, as well as the first embodiment, the alloy of Sn—Ag—Cu is selected as the solder alloy of each of the solder joints (solder-paste bumps) 49 and the nickel is selected as the metal material of the plating of the one surface of the busbar assembly BA1. These selections allow the solder contact angle θ of each of the molten solder joints 49 to be within the angular range of 40 to 45 degrees. This makes it possible to maintain the fillet of each of the molten solder joints 49 in an excellent configuration of gradually inclined like the foot of a mountain, reliably ensuring adequate strength of each of the solder joints 49.

Next, an example of method of manufacturing the electronic apparatus 37 will be described hereinafter.

As illustrated in FIG. 13, a busbar plate 56 is prepared at a first process of the manufacturing method.

The busbar plate 56 is made up of the busbars 41 to 48 before bending and of a plurality of link bars 57 to 64.

The link bar 57 links the legs 42a1 and 42a2 of the busbar 42 and the one lateral end 41a of the busbar 41, and the link bar 58 links the link bar 57 and the terminal bar 50. The link bar 58 links the adjacent terminal bars 50 and 51, the link bar 59 links the adjacent terminal bars 51 and 52, the link bar 60 links the adjacent terminal bars 52 and 53, and the link bar 61 links the adjacent terminal bars 52 and 53.

The link bar 62 links the adjacent terminal bars 53 and 54, and the link bar 63 links the adjacent terminal bars 54 and 55.

The link bar 65 links the one lateral end of the rectangular part 42b of the busbar 42 and the one lateral end 48a of the busbar 48. The link bar 64 links the terminal bar 53 and the link bar 65.

The terminal bars 50 to 55 are formed with the substantially U-shaped bent portions 50a to 55a located between the corresponding busbars and the corresponding link bars, respectively. The U-shaped bent portions 50a to 55a project toward the link bar 57 of the busbar plate 56 orthogonal to the direction of a thickness thereof.

The fitting holes 50b to 53b are formed in the one lateral ends of the busbar 43 to 46 to be penetrated therethrough in their thickness directions, respectively. Similarly, the fitting holes 54b and 55b are formed in the one end of the L-shaped part 42c extending from the middle of the rectangular part 42b of the busbar 42 and the one end 47a projecting from the square part 47b of the busbar 47 penetrated therethrough in their thickness directions, respectively.

Small through holes 42d are so formed in the center portion of the base 42a3 of the concave part of the busbar 42 as to be aligned with each other. On the base 42a3 of the concave part of the busbar 42, part of the bottom surface of the rectangular package of the IC component 38 is mounted.

Similarly, small through holes 42e are so formed in the center of a substantial rectangular base of the L-shaped part 42c continuing to the middle of the rectangular part 42b of the busbar 42 as to be aligned with each other. On the base of the L-shaped part 42c of the busbar 42, part of the bottom surface of the rectangular package of the IC component 39 is mounted.

For example, a substantially copper plate having one surface with which the nickel-plated layer PL is coated is pressed to form the busbar plate 56.

Figure 14:
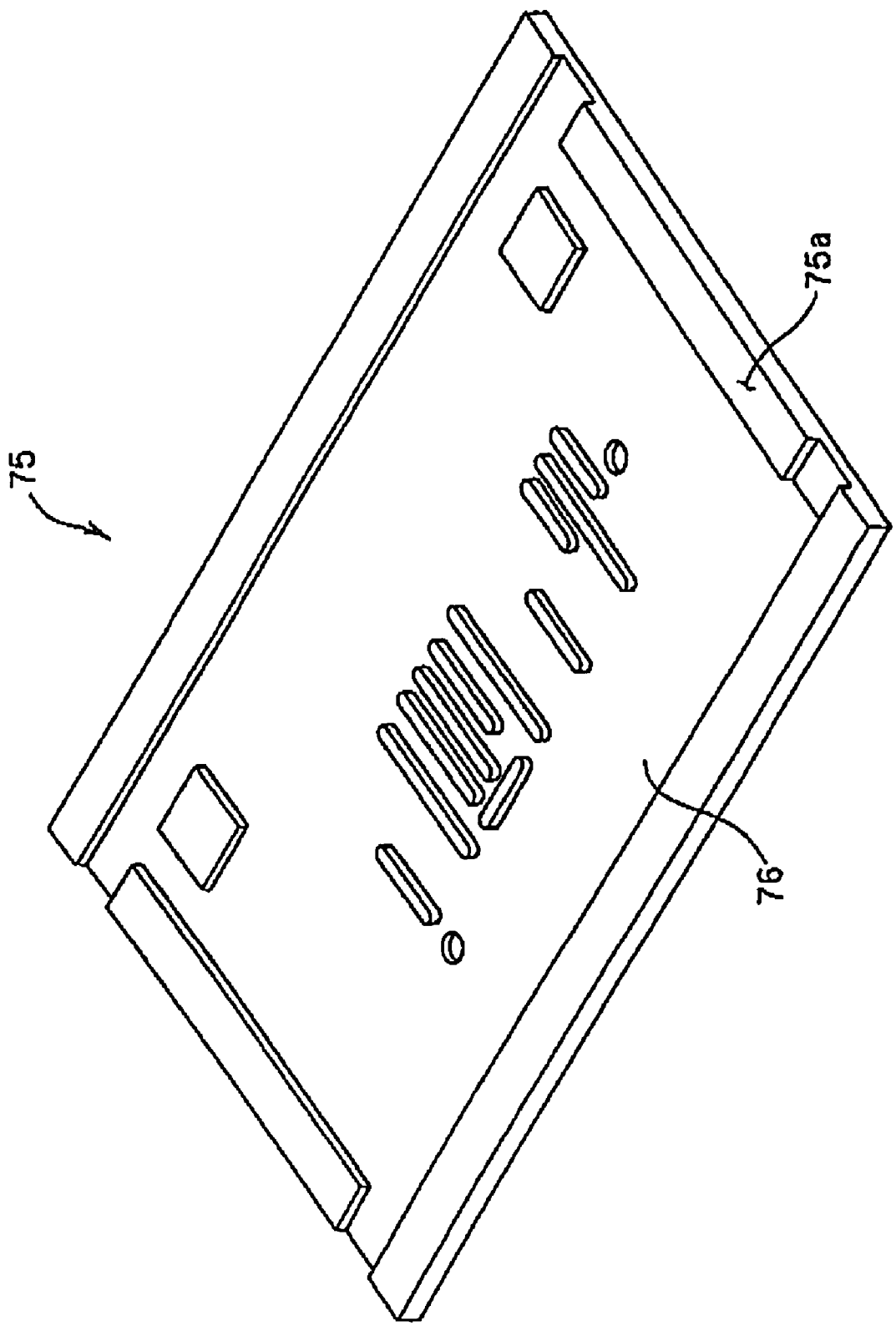
FIG. 14 is a perspective view schematically illustrating an example of the structure of a plate like jig according to the second embodiment.

Next, at a second process of the manufacturing method, a plate like jig 75 having one surface 75a whose area is greater than that of the nickel-plated surface PL1 of the busbar plate 56 is prepared (see FIG. 14).

The jig 75 is formed with a concave groove 76 in the one surface 75a thereof. The outline of the concave groove 76 coincides with that of the busbar plate 56, which allows the busbar plate 56 to be installed in the concave groove 76.

Figure 15:
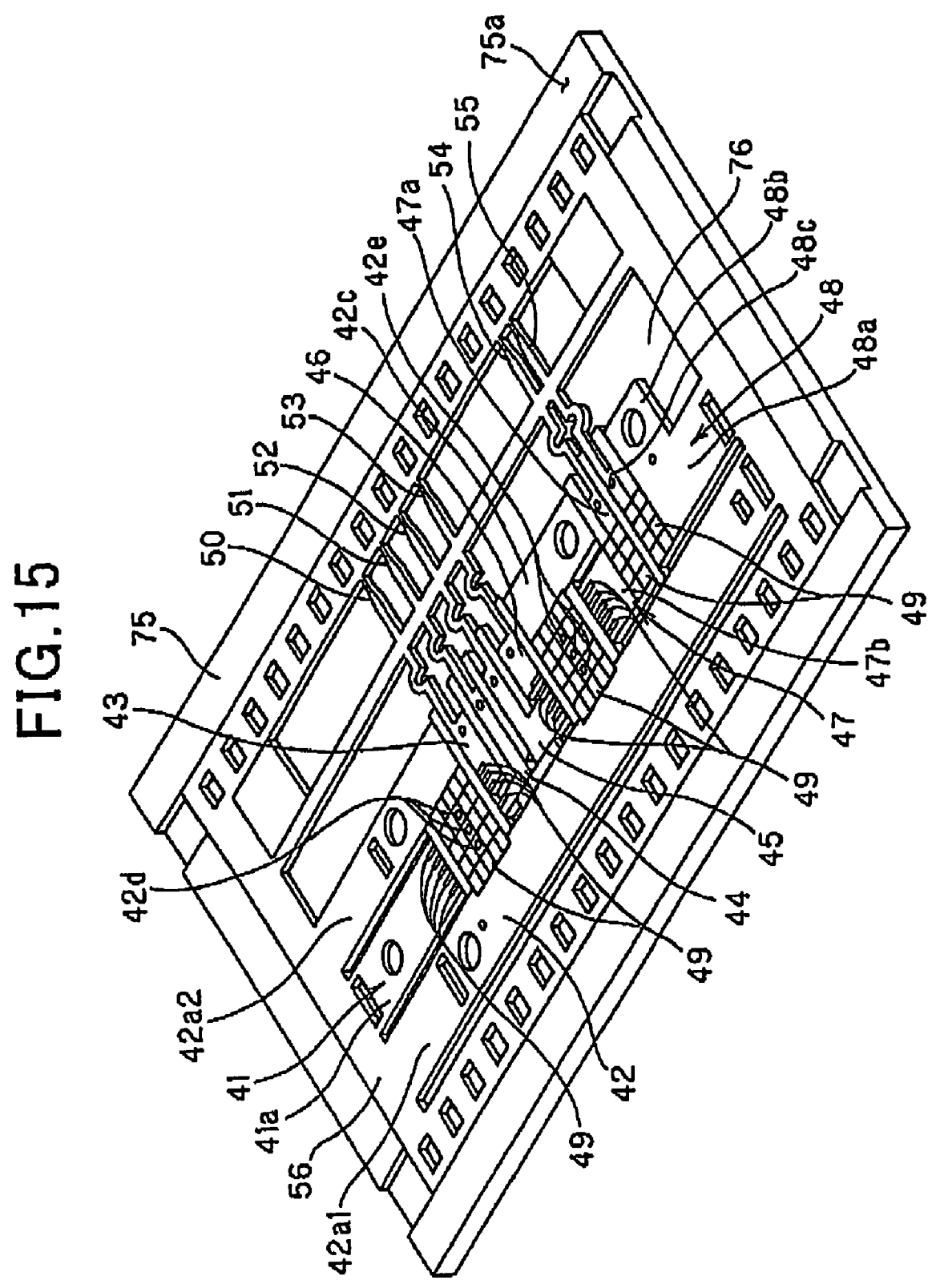

Next, at a third process of the manufacturing method, as illustrated in FIG. 15, the busbar plate 56 is installed in the concave groove 76 of the jig 75.

Thereafter, solder-paste bumps 49, each of which is a cream-like mixture of solder alloy powder and flux, is deposited on at least one predetermined located land of the nickel-plated layer PL1 of at least some of the busbars 41 to 48.

Specifically, five of the solder-paste bumps 49 are deposited on the other lateral end of the busbar 41, and five of the solder-paste bumps 49 are formed on the other lateral ends of the busbars 43 and 44. One of the solder-paste bumps 49 is deposited on the base 42a3 of the concave part of the busbar 42 without being applied in the through holes 42d.

Similarly, five of the solder-paste bumps 49 are deposited on one side of the square part 47b of the busbar 47 opposing the base of the L-shaped part 42c of the busbar 42. Five of the solder-paste bumps 49 are formed on the other lateral ends of the busbars 45 and 46. One of the solder-paste bumps 49 is deposited on the base of the L-shaped part 42c of the busbar 42 without being applied in the through holes 42e.

Two of the solder-paste bumps 49 are deposited on the other side of the square part 47b opposing the one side thereof and on the other lateral end of the rectangular part 48a of the busbar 48.

Figure 16:
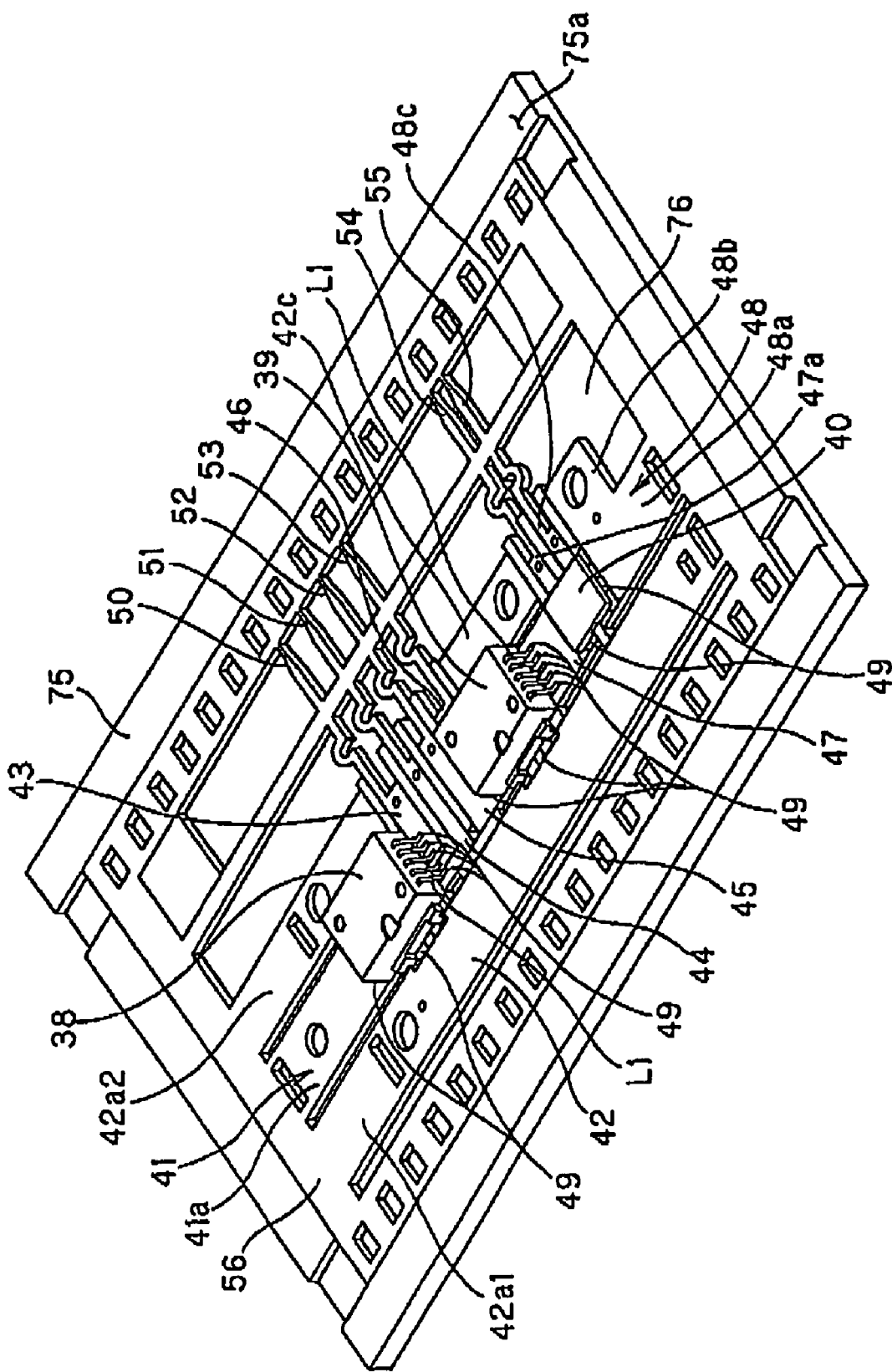
FIG. 16 is a perspective view schematically illustrating a state in which IC components are mounted on the busbar plate according to the second embodiment.

Next, at a fourth process of the manufacturing method, as illustrated in FIG. 16, the IC component 40 is mounted at its bottom surface on the solder-paste bumps 49 located on the other side of the square part 47*b* and on the other lateral end of the rectangular part 48*a* of the busbar 48.

The IC component 38 is mounted at its bottom surface of the rectangular package thereof on the solder-paste bump 49 located on the base 42*a*3 of the concave part of the busbar 42. At the same time, five of the leads L1 extending from the one side of the package of the IC component 38 are respectively mounted on corresponding solder-paste bumps 49 located on the other lateral end of the busbar 41. Similarly, rive of the leads L1 extending from the other side of the package of the IC component 38 are respectively mounted on corresponding solder-paste bumps 49 located on the other lateral ends of the busbars 43 and 44.

The IC component 39 is mounted at its bottom surface of the rectangular package thereof on the solder-paste bump 49 located on the base of the L-shaped part 42*c* of the busbar 42. At the same time, five of the leads L1 extending from the one side of the package of the IC component 39 are respectively mounted on corresponding solder-paste bumps 49 located on the other lateral ends of the busbars 45 and 46. Similarly, five of the leads L1 extending from the other side of the package of the IC component 39 are respectively mounted on corresponding solder-paste bumps 49 located on the one side of the square part 47*b* of the busbar 42.

Thereafter, at a fifth process of the manufacturing method, the busbar plate 56 on which the IC components 38 to 40 are mounted via the solder-paste bumps 49 is placed into a reflow oven together with the jig 75. In the reflow oven, each of the solder-paste bumps 49 on a corresponding one of the lands of the busbars 41 to 48 is reflowed (melted), and thereafter, solidified (reformed). The solidification (reformation) of the melted solder-paste bumps 49 allows the electronic components 38 to 40 to be fixedly mounted on the nickel-plated surface PL1 of the corresponding busbars by the corresponding solder joints 49.

In the second embodiment, like the first embodiment, adjustment of the solder alloy of each of the solder joint 49 and that of the metal material of the metal-plated layer PL1 covering the one surface of the busbar assembly BA1 allow the solder contact angle θ of each of the molten solder joints (bumps) 49 to be within the angular range of 40 to 60 degrees. This makes it possible to prevent each of the molten solder joints 49 on the metal-plated surface PL1 of the corresponding some of the busbars 41 to 48 from being excessively traveled, thus reliably soldering the electronic components 38 to 40 to the corresponding some of the busbars 41 to 48.

Figure 17:
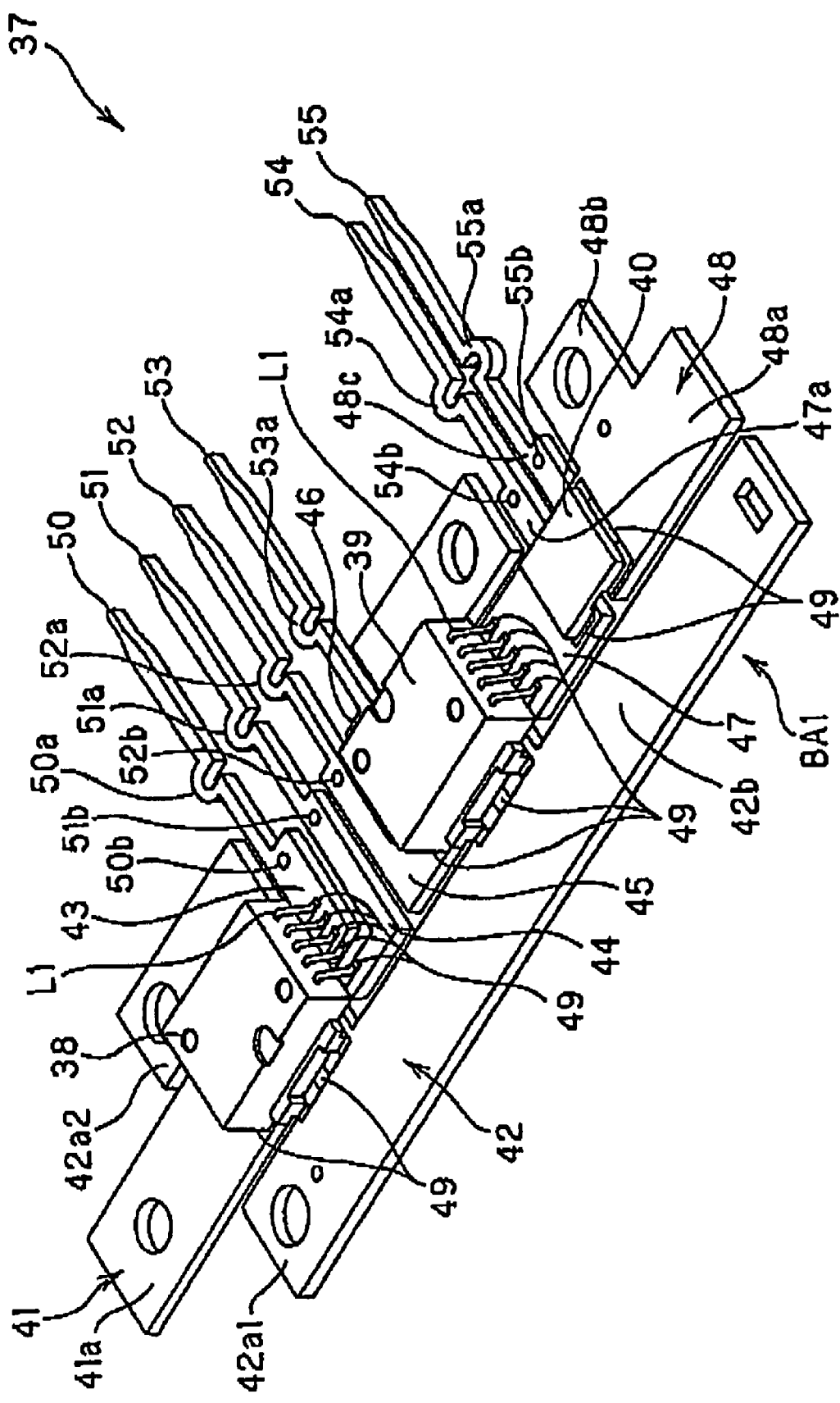
FIG. 17 is a perspective view schematically illustrating a state in which the busbar plate is cut away from the jig and link bars are removed from the busbar plate according to the second embodiment.

After the process (soldering process) of the manufacturing method, the busbar plate 56 is cut away from the jig 75, and the link bars 57 to 65 are removed from the busbar plate 56 (see FIG. 17).

Thereafter, the terminal bars 50, 51, 52, 53, 54, and 55 are orthogonally bent toward the plated-layer sides of the busbars 43, 44, 45, 46, 47, and 48, respectively.

For example, in bending the terminal bar 50, a pair of first and second press dies 77 and 78 each having a rectangular parallelepiped shape are prepared. The first press die 77 has a press surface formed at its center with a fixed projection from the press surface thereof. The fixed projection 77*a* is designed to be fit in the corresponding fitting hole 50*b* of the busbar 43.

Figure 18:
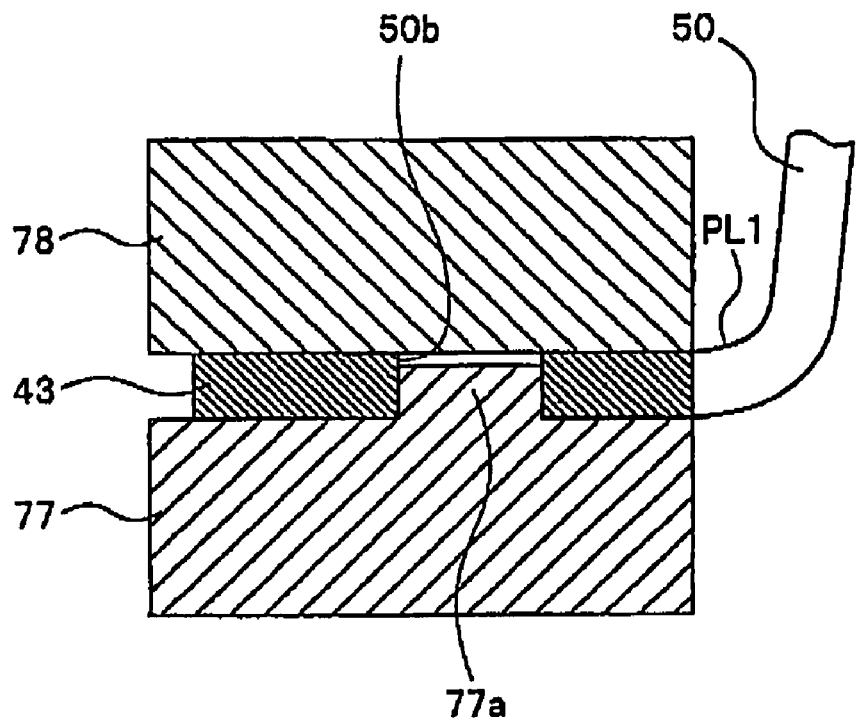
FIG. 18 is a partially cross sectional view schematically illustrating a state in which a fixed projection of a first press die is inserted into a fitting hole of the other lateral end of a busbar from the other surface (non-plated surface) thereof to be fitted therein according to the second embodiment.

Next, as illustrated in FIG. 18, the fixed projection 77*a* of the first press die 77 is inserted into the fitting hole 50*b* of the other lateral end of the busbar 43 from the other surface (non-plated surface) thereof to be fitted therein. This allows the other lateral end of the busbar 43 to be placed on the press surface of the first press die 77.

Thereafter, the second press die 78 is mounted on the other lateral end of the busbar 43 continuing to the corresponding terminal bar 50 so as to press it toward the press surface of the first press die 77, which makes it possible to fixedly support the other lateral end of the busbar 43.

After the fixed support of the other lateral end of the busbar 43 by the first and second press dies 77 and 78, the terminal bar 50 is bent at right angles toward the plated-layer side of the busbar 43. Other terminal bars 51 to 55 are configured to be bent at right angles toward the plated-layer sides of the corresponding busbars 44 to 48, respectively, in the same manner as the bending of the terminal bar 50.

Completion of the bending of each of the terminal bars 50 to 55 provides the electronic apparatus 1 illustrated in FIG. 1.

As described above, in the electronic apparatus 37 according to the second embodiment, as well as the first embodiment, the alloy of Sn—Ag—Cu is selected as the solder alloy of each of the solder joints (solder-paste bumps) 49 and the nickel is selected as the metal material of the plating of the one surface of the busbar assembly BA1. These selections allow the solder contact angle θ of each of the molten solder joints 49 to be within the angular range of 40 to 45 degrees. This makes it possible to maintain the fillet of each of the molten solder joints 49 in an excellent configuration of gradually inclined like the foot of a mountain, reliably ensuring adequate strength of each of the solder joints 49.

The electronic components 38, 39, and 40 are therefore reliably soldered to the corresponding some of the busbars 41 to 48 by soldering without forming solder-resist layers thereon while keeping low the cost of manufacturing the electronic component 37.

In particular, in the second embodiment, the through holes 42*d* are so formed in the center portion of the rectangular base 42*a*3 of the busbar 42 on which part of the bottom surface of the rectangular package of the IC component 38 is mounted by the corresponding solder-paste bump 49 deposited thereon. During the soldering process, the through holes 42*d* allow gas generated at the center portion of the rectangular base 42*a*3 when the corresponding solder-paste bump 49 is melted to be effectively released.

Specifically, assuming that no through holes 42*d* are formed in the center portion of the rectangular base 42*a*3, as compared with the periphery of the rectangular base 42*a*3, gas generated at the center portion thereof is difficult to be delivered out of the base 42*a*3. This therefore prevents creation of voids (air bubbles) in the corresponding solder joint 49, making it possible to improve the reliability of the solder joint 49 between the IC component 38 and the corresponding busbar 42.

Similarly, the through holes 42*e* are so formed in the center portion of the rectangular base of the L-shaped part 42*c* on which part of the bottom surface of the rectangular package of the IC component 39 is mounted by the corresponding solder-paste bump 49 deposited thereon. During the soldering process, the through holes 42*e* allow gas generated when the corresponding solder-paste bump 49 is melted to be effectively released.

Specifically, assuming that no through holes 42*e* are formed in the center portion of the rectangular base of the L-shaped part 42*c*, as compared with the periphery of the rectangular base thereof, gas generated at the center portion is difficult to be delivered out of the base. This therefore prevents creation of voids (air bubbles) in the corresponding solder joint 49, making it possible to improve the reliability of the solder joint 49 between the IC component 39 and the corresponding busbar 42.

In the electronic apparatus 37 according to the second embodiment, the U-shaped bent portions 50a to 55a located between the orthogonally bent portions and tip ends of the terminal bars 50 to 55, respectively, absorb stress applied to the terminal bars 50 to 55 when they are connected to external devices.

Specifically, the terminal bars 50 to 55 are convexly bent to project toward the one lateral side of the busbar assembly BA1 orthogonal to the direction of a thickness thereof, which provides the U-shaped bent portions 50a to 55a. It is therefore unnecessary to bend the terminal bars 50 to 55 in the direction of the thickness of the busbar assembly BA1 (the busbar plate 56) in another press process, and easily to form the U-shaped portions 50 to 55 together with the terminal bars 50 to 55, respectively. This can simplify the manufacturing processes of the electronic apparatus 37, and maintain the cost of manufacturing the electronic apparatus 37.

In the second embodiment, each of the fitting holes 50b to 55b allows the first press die 77 to be reliably secured to a corresponding one of the busbars 43 to 48. In addition, each of the fitting holes 50b to 55b allows the width of a corresponding one of the busbars 43 to 48 at a corresponding one of the fitting holes 50b to 55b to be narrower than the remaining portion of the corresponding one of the busbars 43 to 48.

When each of the terminal bars 50 to 55 is bent in the direction of the thickness of the busbar assembly BA1 toward the plated-layer side of a corresponding one of the busbars 43 to 48, it is possible to therefore concentrate stress into a portion of the corresponding one of the busbars 43 to 48 where the corresponding one of the fitting holes 50b to 55b is formed. Stress to be applied to the corresponding one of the solder joints 49 can be therefore reduced.

In the second embodiment, the busbars 43 to 48 are formed with the fitting holes 50b to 55b, respectively, but the present invention is not limited to the structure.

Typically, the busbar 43 can be formed with an engagement portion that allows part of a jig to be fixedly engaged therewith when the corresponding terminal bar 50 is bent toward one of the main surfaces (one surface and the other surface opposing thereto) thereof.

Figure 19:
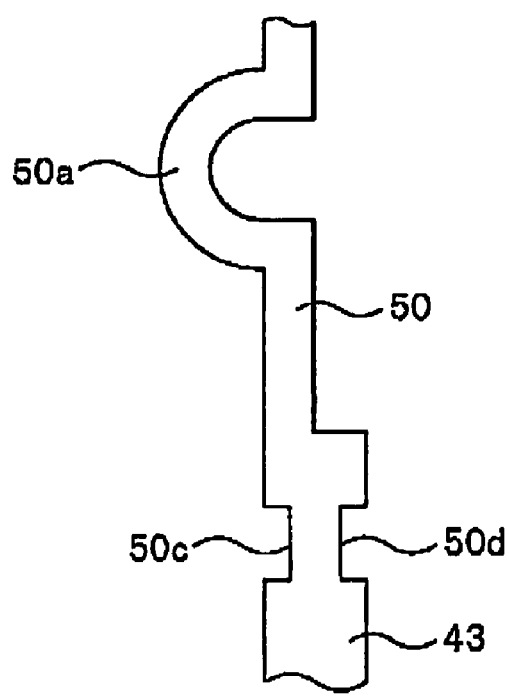
FIG. 19 is an enlarged view schematically illustrating part of a busbar according to a modification of the second embodiment.

For example, the busbar 43 can be formed at its other lateral end with a pair of grooves 50c and 50d on its main surfaces in the thickness direction thereof (see FIG. 19).

In this modification, when the fixed projection 77a of the first press die 77 is fitted into any one of the grooves 50c and 50d of the other lateral end of the busbar 43. This allows the other lateral end of the busbar 43 to be placed on the press surface of the first press die 77.

Thereafter, the second press die 78 is mounted on the other lateral end of the busbar 43 so as to press it toward the press surface of the first press die 77, which makes it possible to fixedly support the other lateral end of the busbar 43.

After the fixed support of the other lateral end of the busbar 43 by the first and second press dies 77 and 78, the terminal bar 50 is bent at right angles toward the plated-layer side of the busbar 43. Other terminal bars 51 to 55 are configured to be bent at right angles toward the plated-layer sides of the corresponding busbars 44 to 48, respectively, in the same manner as the bending of the terminal bar 50 according to the modification.

In each of the first and second embodiments, the alloy of Sn—Ag—Cu is selected as the solder alloy of each of the solder joints (solder-paste bumps) 13 (49) and the nickel is selected as the metal material of the plating of the one surface of the busbar assembly BA (BA1). The present invention is not however limited to the selections.

Specifically, the solder alloy of each of the solder joint 13 (49) can be adjusted to another alloy and the metal material of the metal-plated layer PL (PL1) covering the one surface of the busbar assembly BA (BA1) can be adjusted to another metal material was long as the solder contact angle θ of each of the molten solder joints (bumps) 13 is within the angular range of 40 to 60 degrees.

For example, the solder alloy of each of the solder joint 13 (49) can be adjusted to an Sn—Zn based Pb free solder alloy and the metal material of the metal-plated layer PL (PL1) covering the one surface of the busbar assembly BA (BA1) can be adjusted to a gold (Au) as long as the solder contact angle θ of each of the molten solder joints (bumps) 13 is within the angular range of 40 to 60 degrees.

In addition, the solder alloy of each of the solder joint 13 (49) can be adjusted to the alloy of Sn—Ag—Cu and the metal material of the metal-plated layer PL (PL1) covering the one surface of the busbar assembly BA (BA1) can be adjusted to an alloy of nickel(Ni) and phosphorus(P) as long as the solder contact angle θ of each of the molten solder joints (bumps) 13 is within the angular range of 40 to 60 degrees.

While there has been described what is at present considered to be the first and second embodiments and their modifications of the present invention, it will be understood that various modifications which are not described yet may be made therein, and it is intended to cover in the appended claims all such modifications as fall within the true spirit and scope of the invention.

What is claimed is:

1. An electronic apparatus comprising:
an electronic component;
a busbar assembly composed of a plurality of busbars made of at least one previously selected metal material, each of the plurality of busbars having one surface, the plurality of busbars being arranged to be assembled so as to constitute a predetermined circuit pattern; and
a solder joint made of an alloy of previously selected metal materials and placed on the one surface of at least one of the plurality of busbars, the solder joint being changed from a molten state to a solid state to thereby mechanically and electrically connect the electronic component to the one surface of the at least one of the plurality of busbars, the at least one previously selected metal material of the at least one of the plurality of busbars and the previously selected metal materials of the alloy of the solder joint determining that a contact angle of the solder joint in the molten state with respect to the one surface of the at least one of the plurality of busbars is within an angular range of 40 to 60 degrees.

2. An electronic apparatus according to claim 1, wherein the solder joint is made of the alloy of previously selected lead-free metal materials.

3. An electronic apparatus according to claim 1, wherein each of the plurality of busbars is provided with a plated layer made of the at least one previously selected metal material and formed on the one surface thereof, the at least one previously selected metal material of the plated layer being a nickel.

4. An electronic apparatus according to claim 1, wherein the busbar assembly is formed to be cut away from a busbar plate, the busbar plate comprising:
the plurality of busbars arranged to be assembled so as to constitute the predetermined circuit pattern; and
a link member that links at least one of the plurality of busbars to another at least one of the plurality of busbars.

5. An electronic apparatus according to claim 1, wherein the busbar assembly is composed of a terminal bar joined to at least one external connection busbar included in the plurality of busbars, the terminal bar allowing electrical connection between an external device and the at least one external connection busbar.

6. An electronic apparatus according to claim 5, wherein the terminal bar is configured to be bent with respect to the corresponding at least one external connection busbar.

7. An electronic apparatus according to claim 6, wherein each of the plurality of busbars has the other surface opposing the one surface, the at least one external connection busbar corresponding to the terminal bar is formed with an engagement portion, part of a jig being fixedly engaged with the engagement portion when the terminal bar is bent toward one of the one surface and the other surface thereof.

8. An electronic apparatus according to claim 7, wherein the engagement portion of the at least one external connection busbar is a through hole penetrated therethrough in a direction of thickness between the one surface and the other surface thereof, the part of the jig being inserted to be fitted in the through hole of the at least one external connection busbar when the terminal bar is bent toward one of the one surface and the other surface thereof.

9. An electronic apparatus according to claim 7, wherein the engagement portion of the at least one external connection busbar is a groove formed on at least one of the one surface and the other surface thereof, the part of the jig being fitted in the groove of the at least one external connection busbar when the teal bar is bent toward the one of the one surface and the other surface thereof.

10. An electronic apparatus according to claim 1, wherein each of the plurality of busbars has the other surface opposing the one surface, the electronic component is mounted on a symmetric part of the one surface of the at least one of the plurality of busbars to be mechanically and electrically connected thereto by the solder joint, and the symmetric part of the one surface of the at least one of the plurality of busbars is formed with a through hole, the through hole being penetrated in a direction of thickness between the one surface and the other surface thereof.

11. An electronic apparatus according to claim 10, wherein the through hole is formed at a central portion of the symmetrical part of the one surface of the at least one of the plurality of busbars to be penetrated in the direction of thickness between the one surface and the other surface thereof.

12. An electronic apparatus according to claim 1, wherein each of the plurality of busbars has the other surface opposing the one surface, and the terminal bar is formed with a bent portion orthogonal to a direction of thickness between the one surface and the other surface thereof.

13. A method of manufacturing an electronic apparatus comprising:

preparing an electronic component;

selecting at least one metal material so as to prepare a busbar assembly composed of a plurality of busbars made of the at least one selected metal material, each of the plurality of busbars having one surface, the plurality of busbars being arranged to be assembled so as to constitute a predetermined circuit pattern;

selecting an alloy of metal materials so as to form a solder joint made of the selected alloy of metal materials; and placing the solder joint on the one surface of at least one of the plurality of busbars; and changing the solder joint placed on the one surface of the at least one of the plurality of busbars from a molten state to a solid state to thereby mechanically and electrically connect the electronic component to the one surface of the at least one of the plurality of busbars, the at least one selected metal material of the at least one of the plurality of busbar and the selected alloy of metal materials of the solder joint determining that a contact angle of the solder joint in the molten state with respect to the one surface of the at least one of the plurality of busbars is within an angular range of 40 to 60 degrees.

14. A method according to claim 13, wherein the solder joint is made of the selected alloy of lead-free metal materials.

15. A method according to claim 13, wherein each of the plurality of busbars is provided with a plated layer made of the at least one selected metal material and formed on the one surface thereof, the at least one selected metal material of the plated layer being a nickel.

16. A method according to claim 13, wherein the busbar assembly is formed to be cut away from a busbar plate, the busbar plate comprising:

the plurality of busbars arranged to be assembled so as to constitute the predetermined circuit pattern; and a link member that links at least one of the plurality of busbars to another at least one of the plurality of busbars, the cut of the busbar assembly away from the busbar plate being executed after the electronic component has been mechanical and electrically connected to the one surface of the at least one of the plurality of busbars by the solder joint.

17. A method according to claim 13, wherein the busbar assembly is composed of a terminal bar joined to at least one external connection busbar included in the plurality of busbars, the terminal bar allowing electrical connection between an external device and the at least one external connection busbar.

18. A method according to claim 17, further comprising:

bending the terminal bar with respect to the corresponding at least one external connection busbar after the electronic component has been mechanically and electrically connected to the one surface of the at least one of the plurality of busbars by the solder joint.

* * * * *